(12) United States Patent  
Tsuchimochi et al.

(10) Patent No.: US 11,489,457 B2  
(45) Date of Patent: Nov. 1, 2022

(54) SEMICONDUCTOR MODULE AND POWER CONVERTER USING THE SAME

(71) Applicant: DENSO CORPORATION, Kariya (JP)

(72) Inventors: Shingo Tsuchimochi, Nagakute (JP); Seita Iwahashi, Toyota (JP)

(73) Assignee: DENSO CORPORATION, Kariya (JP)

( * ) Notice: Subject to any disclaimer, the term of this patent is extended or adjusted under 35 U.S.C. 154(b) by 118 days.

(21) Appl. No.: 16/780,267

(22) Filed: Feb. 3, 2020

(65) Prior Publication Data

US 2020/0266727 A1 Aug. 20, 2020

(30) Foreign Application Priority Data

Feb. 20, 2019 (JP) .............................. JP2019-028754

(51) Int. Cl.
*H01L 23/373* (2006.01)
*H02M 7/537* (2006.01)
(Continued)

(52) U.S. Cl.
CPC ........ *H02M 7/537* (2013.01); *H01L 23/3735* (2013.01); *H01L 23/4334* (2013.01);
(Continued)

(58) Field of Classification Search
CPC ...... H02M 7/537; H02M 7/003; H02M 7/493; H02M 7/53875; H01L 23/3735; H01L 23/4334; H01L 23/49531; H01L 23/49562; H01L 23/49575; H01L 25/072; H01L 27/0635; H01L 24/06; H01L 24/29; H01L 24/32; H01L 24/33; H01L 24/48; H01L 24/73; H01L 24/83; H01L 2224/2612;
(Continued)

(56) References Cited

U.S. PATENT DOCUMENTS

2006/0055381 A1* 3/2006 Rice .................... H02M 3/1584
323/271
2009/0231811 A1 9/2009 Tokuyama et al.
(Continued)

FOREIGN PATENT DOCUMENTS

JP 2010-232576 A 10/2010
JP 2012-146760 A 8/2012
(Continued)

OTHER PUBLICATIONS

"Infineon FF400R07A01E3", System Plus Consulting, Jan. 2018, pp. 1-118.

*Primary Examiner* — Elias Ullah
(74) *Attorney, Agent, or Firm* — Sughrue Mion, PLLC

(57) ABSTRACT

A semiconductor module may include a plurality of semiconductor elements; and a first power terminal, a second power terminal and a third power terminal electrically connected to the plurality of semiconductor elements. The plurality of semiconductor elements may include at least one upper arm switching element electrically connected between the first power terminal and the second power terminal; and at least one lower arm switching element electrically connected between the second power terminal and the third power terminal. A number of the at least one upper arm switching element may be different from a number of the at least one lower arm switching element.

20 Claims, 31 Drawing Sheets

(51) Int. Cl.
*H01L 27/06* (2006.01)
*H02M 7/00* (2006.01)
*H01L 25/07* (2006.01)
*H01L 23/433* (2006.01)
*H01L 23/495* (2006.01)
*H02M 7/493* (2007.01)
*H01L 23/00* (2006.01)

(52) U.S. Cl.
CPC .. *H01L 23/49531* (2013.01); *H01L 23/49562* (2013.01); *H01L 23/49575* (2013.01); *H01L 25/072* (2013.01); *H01L 27/0635* (2013.01); *H02M 7/003* (2013.01); *H01L 24/06* (2013.01); *H02M 7/493* (2013.01)

(58) Field of Classification Search
CPC . H01L 2224/29101; H01L 2224/32245; H01L 2224/33181; H01L 2224/73265; H01L 2224/83101; H01L 2924/00014; H01L 2924/19107; H01L 2224/0603; H01L 2224/06181; H01L 2224/48247; H01L 2924/181; H01L 23/3121; H01L 23/58; H01L 25/0652; H01L 23/5385; H01L 23/5386; H01L 23/5389; H01L 24/28; H01L 24/31

See application file for complete search history.

(56) References Cited

U.S. PATENT DOCUMENTS

| | | |
|---|---|---|
| 2010/0244092 A1 | 9/2010 | Ishikawa et al. |
| 2013/0094269 A1 | 4/2013 | Maeda et al. |
| 2013/0094296 A1 | 4/2013 | Maejima et al. |
| 2016/0254206 A1 | 9/2016 | Ohno |

FOREIGN PATENT DOCUMENTS

| | | |
|---|---|---|
| JP | 2014-27816 A | 2/2014 |
| JP | 2015-112015 A | 6/2015 |

* cited by examiner

SEMICONDUCTOR MODULE AND POWER CONVERTER USING THE SAME

CROSS-REFERENCE TO RELATED APPLICATION

This application claims priority to Japanese Patent Application No. 2019-028754, filed on Feb. 20, 2019, the entire contents of which are incorporated herein by reference.

TECHNICAL FIELD

The technology disclosed herein relates to a semiconductor module and a power converter using the same.

BACKGROUND

Japanese Patent Application Publication No. 2015-112015 describes a semiconductor module and a power converter using the same. The semiconductor module includes a plurality of semiconductor elements, and a first power terminal, a second power terminal and a third power terminal that are electrically connected to the plurality of semiconductor elements. The plurality of semiconductor elements includes an upper arm switching element electrically connected between the first power terminal and the second power terminal, and a lower arm switching element electrically connected between the second power terminal and the third power terminal.

SUMMARY

Providing a plurality of upper arm switching elements and a plurality of lower arm switching elements in the above-mentioned power converter can increase an allowable current which can be handled by the power converter. In this case, as one example, considerations are given to adding new upper and lower arm switching elements to inside of the semiconductor module. However, adding at least two switching elements inside the semiconductor module results in a significant increase in the size of the semiconductor module. Consequently, drastic design changes might be required not only for the semiconductor module but also for the power converter. On the other hand, considerations are also given to preparing a plurality of semiconductor modules and connecting them in parallel without changing the configuration of the semiconductor modules. In this case, design changes required for the power converter are often relatively less drastic. However, the increase in the number of semiconductor modules simply results in an increase in the size of the power converter. In view of this, the disclosure herein provides a technology that can at least partially solve such problems.

The technology disclosed herein allows the number of upper arm switching elements and the number of lower arm switching elements to be different from each other in one semiconductor module. Thus, the number of required semiconductor modules can be reduced, and further an increase in the size of each semiconductor module can be suppressed. For example, assuming that a power converter needs three upper arm switching elements and three lower arm switching elements. In this case, according to the present technology, two semiconductor modules are connected in parallel, only one new upper arm switching element is added to one of the two semiconductor modules, and only one new lower arm switching element is added to the other of the two semiconductor modules. Due to this, an increase in the number of required semiconductor modules can be suppressed, and further an increase in the size of each semiconductor module can be suppressed.

According to an aspect of the present technology, a semiconductor module is disclosed. The semiconductor module may include a plurality of semiconductor elements; and a first power terminal, a second power terminal and a third power terminal electrically connected to the plurality of semiconductor elements. The plurality of semiconductor elements may include at least one upper arm switching element electrically connected between the first power terminal and the second power terminal, and at least one lower arm switching element electrically connected between the second power terminal and the third power terminal. A number of the at least one upper arm switching element may be different from a number of the at least one lower arm switching element.

In the semiconductor module described above, the at least one upper arm switching element may include a first switching element, and the at least one lower arm switching element may include a second switching element that has a same configuration as the first switching element. The at least one upper arm switching element or the at least one lower arm switching element may further include a third switching element having a different configuration from the first switching element. As another embodiment, the third switching element may have the same configuration as the first switching element and the second switching element. Herein, two switching elements having the same configuration means that the two switching elements are configured to have the same configuration (in terms of size, material, structure, etc.), except for inevitable differences therebetween due to the manufacture.

In one embodiment of the present technology, the first switching element may be mainly constituted of a first type of semiconductor material, and the third switching element may be mainly constituted of a second type of semiconductor material different from the first type of semiconductor material. Constituting the first switching element and the third switching element of different semiconductor materials allows their characteristics to significantly differ. Due to this, these two switching elements with the different characteristics can be selectively used, for example, depending on an index related to the semiconductor module (for example, a current value).

In the embodiment described above, a band gap of the second type of semiconductor material may be wider than a band gap of the first type of semiconductor material. In this case, for example, the first type of semiconductor material may be silicon (Si), and the second type of semiconductor material may be silicon carbide (SiC), a nitride semiconductor such as gallium nitride (GaN), or an oxide semiconductor. However, a specific combination of the first type of semiconductor material and the second type of semiconductor material is arbitrary and is not limited to these examples.

Additionally or alternatively to the above, a size of the third switching element may be smaller than a size of the first switching element. If the size of the third switching element is relatively small, adding the third switching element to an existing semiconductor module can suppress an increase in the size of the semiconductor module, for example.

According to another aspect of the present technology, a power converter is further disclosed herein. The power converter may include a first semiconductor module and a second semiconductor module electrically connected to the first semiconductor module. Each of the first semiconductor module and the second semiconductor module may include a plurality of semiconductor elements; and a first power terminal, a second power terminal and a third power terminal electrically connected to the plurality of semiconductor elements. The plurality of semiconductor elements may include at least one upper arm switching element electrically connected between the first power terminal and the second power terminal and at least one lower arm switching element electrically connected between the second power terminal and the third power terminal. The first power terminal, the second power terminal and the third power terminal of the first semiconductor module may be electrically connected to the first power terminal, the second power terminal and the third power terminal of the second semiconductor module, respectively. In the first semiconductor module, a number of the at least one upper arm switching element may be greater than the number of the at least one lower arm switching element. In the second semiconductor module, a number of the at least one upper arm switching element may be smaller than a number of the at least one lower arm switching element.

In an embodiment of the present technology, a total number of the at least one upper arm switching element and the at least one lower arm switching element of the first semiconductor module may be equal to a total number of the at least one upper arm switching element and the at least one lower arm switching element of the second semiconductor module. With such a configuration, the first semiconductor module and the second semiconductor module can have the same or substantially the same size.

In an embodiment of the present technology, the power converter may further include a third semiconductor module. In this case, the third semiconductor module may include a plurality of semiconductor elements and a first power terminal, a second power terminal and a third power terminal electrically connected to the plurality of semiconductor elements. The plurality of semiconductor elements may include at least one upper arm switching element electrically connected between the first power terminal and the second power terminal, and at least one lower arm switching element electrically connected between the second power terminal and the third power terminal. The first power terminal, the second power terminal and the third power terminal of the third semiconductor module may be electrically connected to the first power terminal, the second power terminal and the third power terminal of the second semiconductor module, respectively. In the third semiconductor module, a number of the at least one upper arm switching element may be equal to a number of the at least one lower arm switching element. By further combining the third semiconductor module with the first and second semiconductor modules, the number of the upper arm switching elements and the number of the lower arm switching elements can be adjusted appropriately.

In an embodiment of the present technology, the at least one upper arm switching element of the first semiconductor module and the at least one upper arm switching element of the second semiconductor module each may include a first switching element. The at least one lower arm switching element of the first semiconductor module and the at least one lower arm switching element of the second semiconductor module each may include a second switching element having a same configuration as the first switching element. The at least one upper arm switching element of the first semiconductor module and the at least one lower arm switching element of the second semiconductor module each may further include a third switching element having a different configuration from the first switching element. With such a configuration, the power converter can selectively use at least two types of switching elements depending on, for example, magnitude of electric power it needs to handle. Herein, two switching elements having the same configuration means that the two switching elements are configured to have the same configuration (in terms of size, material, structure, etc.) except for inevitable differences therebetween due to the manufacture.

In the embodiment described above, the power converter may further include a controller configured to control operations of the first semiconductor module and the second semiconductor module. In this case, the controller may be configured to perform a first switching control under which the third switching elements of the first semiconductor module and the second semiconductor module are driven in a complementary manner and the first switching elements and the second switching elements of the first semiconductor module and the second semiconductor module are not driven. Under the first switching control, the two switching elements located in the different semiconductor modules are driven, by which an increase in the temperature of each semiconductor module can be suppressed.

In the embodiment described above, the controller may be further configured to perform a second switching control under which at least one of the first switching elements of the first semiconductor module and the second semiconductor module and at least one of the second switching elements of the first semiconductor module and the second semiconductor module are driven in a complementary manner and the third switching elements of the first semiconductor module and the second semiconductor module are not driven. With such a configuration, power conversion efficiency can be enhanced by selectively performing the first switching control and the second switching control depending on, for example, the magnitude of electric power the power converter needs to handle.

BRIEF DESCRIPTION OF DRAWINGS

FIG. 6 is a plan view perpendicular to a first conductor plate 42, and omits illustration of an encapsulant 28 and a second insulated circuit substrate 50.

FIG. 13 is a plan view perpendicular to a first conductor plate 92, and omits illustration of an encapsulant 78 and a second insulated circuit substrate 100.

FIG. 22 is a plan view perpendicular to the first conductor plate 42, and omits illustration of the encapsulant 28 and the second insulated circuit substrate 50.

FIG. 26 is a plan view perpendicular to the first conductor plate 42, and omits illustration of the encapsulant 28 and the second insulated circuit substrate 50.

FIG. 30 is a plan view perpendicular to the first conductor plate 92, and omits illustration of the encapsulant 78 and the second insulated circuit substrate 100.

DETAILED DESCRIPTION

Figure 1:
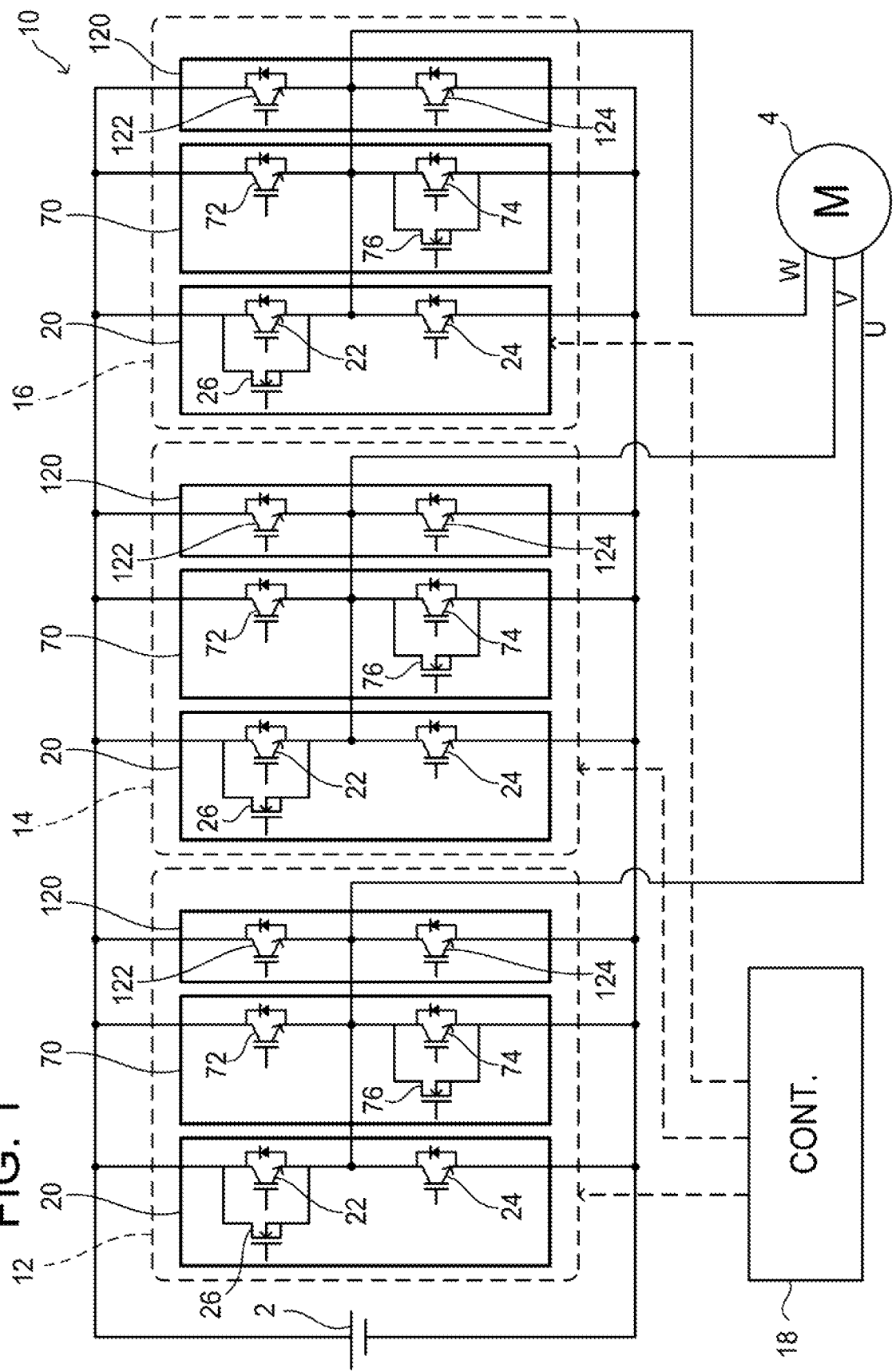
FIG. 1 is a circuit block diagram showing a configuration of a power converter 10 of an embodiment.
Figure 2:
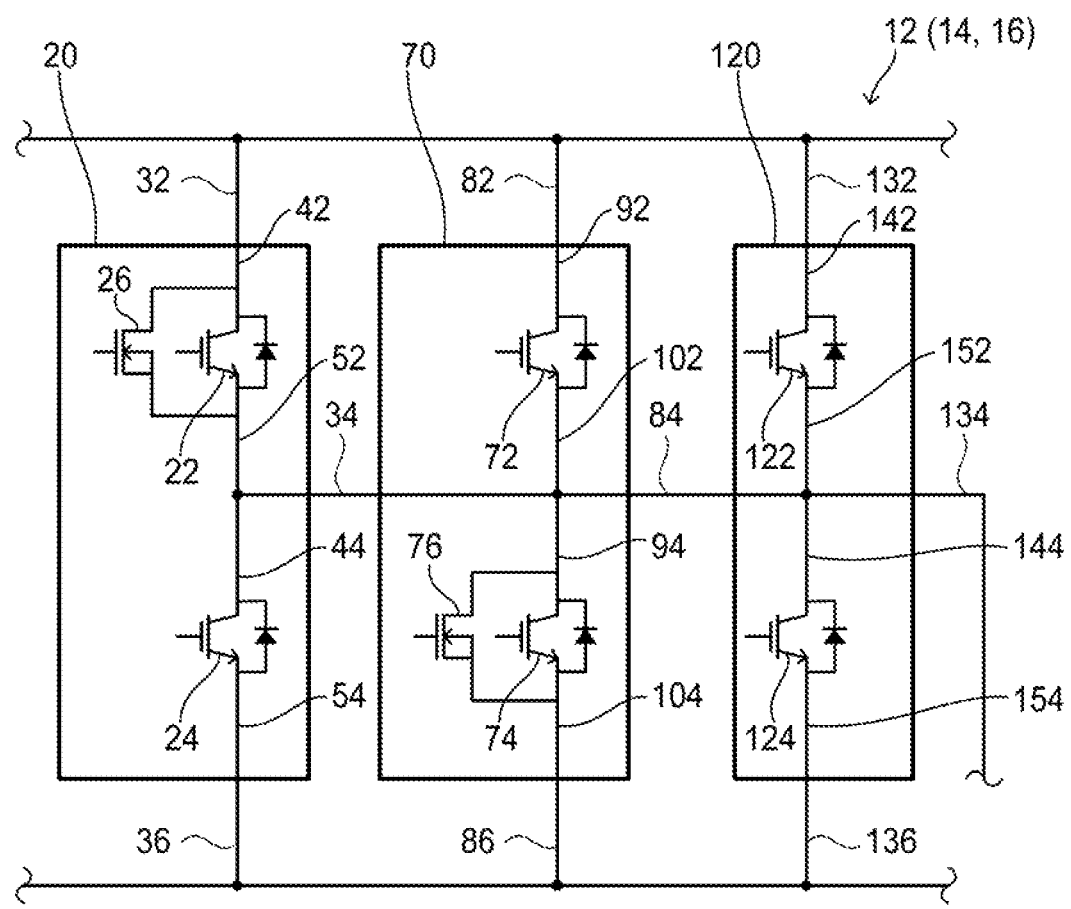
FIG. 2 is a circuit block diagram showing a configuration of a U-phase switching circuit 12. A V-phase switching circuit 14 and a W-phase switching circuit 16 each also have the same configuration as the U-phase switching circuit 12.

In an embodiment of the present technology, the semiconductor module may further include a first conductor plate on which the at least one upper arm switching element is disposed; a second conductor plate opposed to the first conductor plate with the at least one upper arm switching element interposed therebetween; a third conductor plate on which the at least one lower arm switching element is disposed and which is arranged side by side with the first conductor plate in a first direction and is electrically connected to the second conductor plate; and a fourth conductor plate which is opposed to the third conductor plate with the at least one lower arm switching element interposed therebetween and is arranged side by side with the second conductor plate in the first direction. In this case, the first power terminal may be electrically connected to the first conductor plate, the second power terminal may be electrically connected to the second conductor plate or the third conductor plate, and the third power terminal may be electrically connected to the fourth conductor plate. With such a configuration, heat generated by each semiconductor element can be effectively dissipated from both sides thereof via a pair of the conductor plates.

In the embodiment described above, the first switching element and the second switching element may be arranged along the first direction. The third switching element may be located between the first switching element and the second switching element with respect to the first direction. The phrase "with respect to the first direction" herein means paying attention only to positional relationship in the first direction while ignoring positional relationship in a direction perpendicular to the first direction. The same applies to the same or similar phrases (for example, "with respect to the second direction") throughout the disclosure herein.

In the embodiment described above, in a plan view perpendicular to the first conductor plate, a center of the third switching element may be offset from a straight line passing through respective centers of the first switching element and the second switching element. That is, the third switching element may be offset with respect to an arrangement of the first switching element and the second switching element.

In the embodiment described above, the third conductor plate may be electrically connected to the second conductor plate via a first coupling portion, and the third power terminal may be electrically connected to the fourth conductor plate via a second coupling portion. In this case, the first coupling portion and the second coupling portion may be located between the first switching element and the second switching element with respect to the first direction. This configuration is advantageous when a size of the third switching element is smaller than sizes of the first switching element and the second switching element, although not particularly limited so.

In the embodiment described above, the first coupling portion and the second coupling portion may be located on a same side relative to the third switching element with respect to a second direction parallel to the first conductor plate and perpendicular to the first direction. With such a configuration, a current pathway in the semiconductor module can be shortened because the first coupling portion and the second coupling portion are adjacent to each other.

In the embodiment described above, in a plan view perpendicular to the first conductor plate, the first coupling portion and the second coupling portion each may extend along the first direction and may be adjacent to each other in the second direction. With such a configuration, the first coupling portion and the second coupling portion extend along the third switching element, therefore a current pathway between the third switching element and the first coupling portion (or the second coupling portion) can be widened.

Alternatively, in the plan view perpendicular to the first conductor plate, the first coupling portion and the second coupling portion each may extend along the second direction and may be adjacent to each other in the first direction. With such a configuration, an interval between the first conductor plate and the third conductor plate and an interval between the second conductor plate and the fourth conductor plate can be increased, by which insulation between these conductor plates can be enhanced.

In another embodiment, the first coupling portion and the second coupling portion may be located opposite to each other relative to the third switching element with respect to the above-described second direction. With such a configuration, a current pathway between the third switching element and the third power terminal can be shortened by arranging the third switching element and the second coupling portion adjacent to each other.

In the embodiment described above, in the plan view perpendicular to the first conductor plate, the first coupling portion may extend along the second direction, and the second coupling portion may extend along the first direction. With such a configuration, particularly because the first coupling portion extends along the second direction, a space can be provided, for example, for connecting signal wiring to the third switching element.

In an embodiment of the present technology, in the plan view perpendicular to the first conductor plate, the first power terminal, the second power terminal, and the third power terminal may be arranged along the first direction. In this case, the third power terminal may be located between the first power terminal and the second power terminal. With such a configuration, each power terminal can be located close to its corresponding conductor plate.

In an embodiment of the present technology, if the third switching element is included in the at least one upper arm switching element, the first conductor plate may include a first protrusion protruding toward the third conductor plate along the first direction. Further, at least a part of the third switching element may be located at the first protrusion. By partly enlarging the first conductor plate in accordance with the size of the third switching element, the size of the semiconductor module can be reduced.

In the embodiment described above, the second conductor plate may include a second protrusion protruding toward the fourth conductor plate along the first direction and opposed to the first protrusion. In this case, at least a part of the second protrusion may be opposed to the first protrusion with the third switching element interposed therebetween. That is, a protrusion may be provided in the second conductor plate to correspond to the protrusion of the first conductor plate.

In the embodiment described above, the third conductor plate may include a third protrusion protruding toward the first conductor plate along the first direction and adjacent to the first protrusion in the second direction perpendicular to the first direction. In this case, the third conductor plate may be electrically connected to the second conductor plate at the third protrusion. With such a configuration, the size of the semiconductor module can be reduced.

In the embodiment described above, the fourth conductor plate may include a fourth protrusion protruding toward the second conductor plate along the first direction and at least partly opposed to the third protrusion. In this case, the fourth conductor plate may be electrically connected to the third power terminal at the fourth protrusion. With such a configuration, the size of the semiconductor module can be further reduced.

In an embodiment of the present technology, if the third switching element is included in the at least one lower arm switching element, the fourth conductor plate may include a fourth protrusion protruding toward the second conductor plate along the first direction. In this case, at least a part of the fourth protrusion may be opposed to the third conductor plate with the third switching element interposed therebetween. By partly enlarging the fourth conductor plate in accordance with the size of the third switching element, the size of the semiconductor module can be reduced.

In the embodiment described above, the second conductor plate may include a second protrusion protruding toward the fourth conductor plate along the first direction and adjacent to the fourth protrusion in the second direction perpendicular to the first direction. In this case, the second conductor plate may be electrically connected to the third conductor plate at the second protrusion. With such a configuration, the size of the semiconductor module can be further reduced.

In an embodiment of the present technology, the semiconductor module may further include a first insulated circuit substrate and a second insulated circuit substrate opposed to the first insulated circuit substrate with the plurality of semiconductor elements interposed therebetween. In this case, the first conductor plate and the third conductor plate may be provided in the first insulated circuit substrate, and the second conductor plate and the fourth conductor plate may be provided in the second insulated circuit substrate. The term "insulated circuit substrate" herein means an insulated substrate (for example, ceramic substrate) that has a conductor plate joined to one surface or both surfaces thereof, such as an Active Metal Brazed Copper (AMC) substrate, a Direct Bonded Coper (DBC) substrate, or a Direct Bonded Aluminum (DBA) substrate.

Representative, non-limiting examples of the present disclosure will now be described in further detail with reference to the attached drawings. This detailed description is merely intended to teach a person of skill in the art further details for practicing aspects of the present teachings and is not intended to limit the scope of the present disclosure. Furthermore, each of the additional features and teachings disclosed below may be utilized separately or in conjunction with other features and teachings to provide improved semiconductor modules and/or power converters, as well as methods for using and manufacturing the same.

Moreover, combinations of features and steps disclosed in the following detailed description may not be necessary to practice the present disclosure in the broadest sense, and are instead taught merely to particularly describe representative examples of the present disclosure. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

Embodiments

Referring to the drawings, a power converter 10 of an embodiment will be described. The power converter 10 of the present embodiment is employed in an electrically powered vehicle, such as an electric vehicle, a hybrid vehicle, and a fuel cell vehicle, and is configured to convert electric power between a DC power source 2 and a motor 4. It should be noted that applications of the power converter 10 are not particularly limited. The power converter 10 can be widely employed in various apparatuses and facilities.

As shown in FIG. 1, the power converter 10 includes a U-phase switching circuit 12, a V-phase switching circuit 14, a W-phase switching circuit 16, and a controller 18 configured to control operations of the switching circuits 12, 14, and 16. The U-phase switching circuit 12 is electrically connected between the DC power source 2 and a U-phase terminal of the motor 4, and is configured to connect the U-phase terminal of the motor 4 selectively to one of a positive electrode and a negative electrode of the DC power source 2. The V-phase switching circuit 14 is electrically connected between the DC power source 2 and a V-phase terminal of the motor 4, and is configured to connect the V-phase terminal of the motor 4 selectively to one of the positive electrode and the negative electrode of the DC power source 2. The W-phase switching circuit 16 is electrically connected between the DC power source 2 and a W-phase terminal of the motor 4, and is configured to connect the W-phase terminal of the motor 4 selectively to one of the positive electrode and the negative electrode of the DC power source 2.

The U-phase switching circuit 12 includes a plurality of semiconductor modules 20, 70, and 120. The plurality of semiconductor modules 20, 70, and 120 are connected in parallel with each other. The number of semiconductor modules 20, 70, and 120 is not particularly limited. In the present embodiment, the plurality of semiconductor modules 20, 70, and 120 includes a first semiconductor module 20, a second semiconductor module 70, and a third semiconductor module 120. The V-phase switching circuit 14 and the W-phase switching circuit 16 each have the same configuration as the U-phase switching circuit 12, and each include the first semiconductor module 20, the second semiconductor module 70, and the third semiconductor module 120.

Each first semiconductor module 20 includes a plurality of semiconductor elements 22, 24 and 26 and a plurality of power terminals 32, 34 and 36 electrically connected to the plurality of semiconductor elements 22, 24 and 26. The plurality of power terminals 32, 34 and 36 includes a first power terminal 32, a second power terminal 34 and a third power terminal 36. The first power terminal 32 is connected to the positive electrode of the DC power source 2. The second power terminal 34 is connected to the motor 4. The third power terminal 36 is connected to the negative electrode of the DC power source 2.

The plurality of semiconductor elements 22, 24 and 26 includes at least one upper arm switching element 22, 26, and at least one lower arm switching element 24. The at least one upper arm switching element 22, 26 is electrically connected between the first power terminal 32 and the second power terminal 34, and the at least one lower arm switching element 24 is electrically connected between the second power terminal 34 and the third power terminal 36. The at least one upper arm switching element 22, 26 includes a first switching element 22 and a third switching element 26, and the at least one lower arm switching element 24 includes a second switching element 24, although this is merely an example. As above, each first semiconductor module 20 includes the two upper arm switching elements 22 and 26 and the one lower arm switching element 24. Thus, the number of the upper arm switching elements 22 and 26 is greater than the number of the lower arm switching element 24.

The first switching element 22 and the second switching element 24 have the same configuration as each other. On the other hand, the third switching element 26 has a different configuration from the first switching element 22 and the second switching element 24. In detail, the first switching element 22 and the second switching element 24 are mainly constituted of silicon (Si), while the third switching element 26 is mainly constituted of silicon carbide (SiC) having a wider band gap than silicon. Further, the size of the third switching element 26 is smaller than that of the first switching element 22 and the second switching element 24. In general, silicon carbide substrates have more excellent properties than silicon substrates, but are more expensive than silicon substrates. Therefore, by using silicon carbide as the material of the third switching element 26 which has a smaller size, characteristics of the first semiconductor module 20 can be improved, and further an increase in the manufacturing cost thereof can be suppressed.

The first switching element 22 and the second switching element 24 in the present embodiment are Reverse Conducting Insulated Gate Bipolar Transistors (RC-IGBTs) which are IGBTs including built-in freewheeling diodes, while the third switching element 26 is a Metal-Oxide-Semiconductor Field-Effect Transistor (MOSFET), although this is merely an example. It should be noted that the first switching element 22 and the second switching element 24 may be IGBTs that do not include a built-in freewheeling diode. In this case, another semiconductor element including a diode may be added. Alternatively, the first switching element 22 and the second switching element 24 may be MOSFETs. The third switching element 26 may be an RC-IGBT or an IGBT.

Each second semiconductor module 70 includes a plurality of semiconductor elements 72, 74 and 76 and a plurality of power terminals 82, 84 and 86 electrically connected to the plurality of semiconductor elements 72, 74 and 76. The plurality of power terminals 82, 84 and 86 includes a first power terminal 82, a second power terminal 84 and a third power terminal 86. Also in the second semiconductor module 70, the first power terminal 82 is connected to the positive electrode of the DC power source 2, the second power terminal 84 is connected to the motor 4, and the third power terminal 86 is connected to the negative electrode of the DC power source 2. That is, the first power terminal 82, the second power terminal 84 and the third power terminal 86 of the second semiconductor module 70 are electrically connected to the first power terminal 32, the second power terminal 34 and the third power terminal 36 of the corresponding first semiconductor module 20, respectively.

The plurality of semiconductor elements 72, 74 and 76 of the second semiconductor module 70 includes at least one upper arm switching element 72 and at least one lower arm switching element 74, 76. The at least one upper arm switching element 72 is electrically connected between the first power terminal 82 and the second power terminal 84, and the at least one lower arm switching element 74, 76 is electrically connected between the second power terminal 84 and the third power terminal 86. The at least one upper arm switching element 72 includes a first switching element 72, and the at least one lower arm switching element 74, 76 includes a second switching element 74 and a third switching element 76, although this is merely an example. As above, each second semiconductor module 70 includes the one upper arm switching element 72 and the two lower arm switching elements 74 and 76, thus the number of the lower arm switching elements 74 and 76 is greater than the number of the upper arm switching element 72.

Also in the second semiconductor module 70, the first switching element 72 and the second switching element 74 have the same configuration as each other, and the third switching element 76 has a different configuration from the first switching element 72 and the second switching element 74. Here, the first switching element 72 and the second switching element 74 in the second semiconductor module 70 have the same configuration as the first switching element 22 and the second switching element 24 of the first semiconductor module 20. Further, the third switching element 76 in the second semiconductor module 70 has the same configuration as the third switching element 26 in the first semiconductor module 20. That is, also in the second semiconductor module 70, the first switching element 72 and the second switching element 74 are mainly constituted of silicon (Si), while the third switching element 76 is mainly constituted of silicon carbide (SiC). Further, the size of the third switching element 76 is smaller than that of the first switching element 72 and the second switching element 74.

Here, in the first semiconductor module 20 and the second semiconductor module 70, the numbers of the switching elements 22, 24, 26, 72, 74 and 76 are not particularly limited. Although not particularly limited, in the power converter 10 of the present embodiment, a total number of the upper arm switching elements 22, 26 and the lower arm switching element 24 in the first semiconductor module 20 is equal to a total number of the upper arm switching element 72 and the lower arm switching elements 74, 76 in the second semiconductor module 70. Further, a total number of the upper arm switching elements 22, 26 and 72 in the first semiconductor module 20 and the second semiconductor module 70 is equal to a total number of the lower arm switching elements 24, 74 and 76 in the first semiconductor module 20 and the second semiconductor module 70.

Each third semiconductor module 120 includes a plurality of semiconductor elements 122 and 124 and a plurality of power terminals 132, 134 and 136 electrically connected to the plurality of semiconductor elements 122 and 124. The plurality of power terminals 132, 134 and 136 includes a first power terminal 132, a second power terminal 134 and a third power terminal 136. Also in the third semiconductor module 120, the first power terminal 132 is connected to the positive electrode of the DC power source 2, the second power terminal 134 is connected to the motor 4, and the third power terminal 136 is connected to the negative electrode of the DC power source 2. That is, the first power terminal 132, the second power terminal 134 and the third power terminal 136 of the third semiconductor module 120 are electrically connected to the first power terminal 32, the second power terminal 34 and the third power terminal 36 of the first semiconductor module 20, respectively.

The plurality of semiconductor elements 122 and 124 of the third semiconductor module 120 includes at least one upper arm switching element 122 and at least one lower arm switching element 124. The at least one upper arm switching element 122 is electrically connected between the first power terminal 132 and the second power terminal 134, and the at least one lower arm switching element 124 is electrically connected between the second power terminal 134 and the third power terminal 136. The at least one upper arm switching element 122 includes a first switching element 122, and the at least one lower arm switching element 124 includes a second switching element 124, although this is merely an example. The third semiconductor module 120 includes one upper arm switching element 122 and one lower arm switching element 124, thus the number of the upper arm switching element 122 is equal to the number of the lower arm switching element 124. The first switching element 122 and the second switching element 124 have the same configuration as each other, and this configuration is the same as the configuration of the first switching elements 22 and 72 and the second switching elements 24 and 74 in the other semiconductor modules 20 and 70.

As described above, the U-phase switching circuit 12 includes the three semiconductor modules 20, 70 and 120. The semiconductor modules 20, 70 and 120 include the at least one upper arm switching element 22, 26, 72 and 122, and the at least one lower arm switching element 24, 74, 76 and 124, respectively. In particular, the first semiconductor module 20 includes the two upper arm switching elements 22 and 26, and the number of the upper arm switching elements 22 and 26 is greater than the number of the lower arm switching element 24. Meanwhile, the second semiconductor module 70 includes the two lower arm switching elements 74 and 76, and the number of the lower arm switching elements 74 and 76 is greater than the number of the upper arm switching element 72. However, in the entire U-phase switching circuit 12, the total number of the upper arm switching elements 22, 26, 72 and 122 is equal to the total number of the lower arm switching elements 24, 74, 76 and 124.

The V-phase switching circuit 14 and the W-phase switching circuit 16 each have the same configuration as the U-phase switching circuit 12. That is, the V-phase switching circuit 14 and the W-phase switching circuit 16 each also include the plurality of semiconductor modules 20, 70, and 120, which includes the first semiconductor module 20, the second semiconductor module 70, and the third semiconductor module 120. Each of the switching circuits 12, 14, and 16 may include at least the first semiconductor module 20 and the second semiconductor module 70. Alternatively, each of the switching circuits 12, 14, and 16 may include three or more semiconductor modules. In either case, the total number of the upper arm switching elements 22, 26, 72 and 122 may be equal to the total number of the lower arm switching elements 24, 74, 76 and 124 in each of the switching circuits 12, 14 and 16, although not particularly limited so.

In the power converter 10 of the present embodiment, the number of the upper arm switching elements 22 and 26 is different from the number of the lower arm switching elements 24 in the first semiconductor modules 20, and the number of the upper arm switching elements 72 is different from the number of the lower arm switching elements 74 and 76 in the second semiconductor modules 70. Allowing for the difference between the number of the upper arm switching elements 22 and 26 and the number of the lower arm switching elements 24 in some semiconductor modules 20 as well as the difference between the number of the upper arm switching elements 72 and the number of the lower arm switching elements 74 and 76 in some semiconductor modules 70 as above can suppress an increase in the size of the respective semiconductor modules 20 and 70 and further can suppress the number of required semiconductor modules 20, 70 and 120. That is, in the power converter 10 of the present embodiment, only one third switching element 26 is added to each first semiconductor module 20, and only one third switching element 76 is added to each second semiconductor module 70, as compared to the third semiconductor modules 120. This can suppress an increase in the size of each first semiconductor module 20 as compared to a case where two third switching elements 26 and 76 are added to each first semiconductor module 20, and further can make the three semiconductor modules 20, 70 and 120 substantially the same size.

Figure 3:
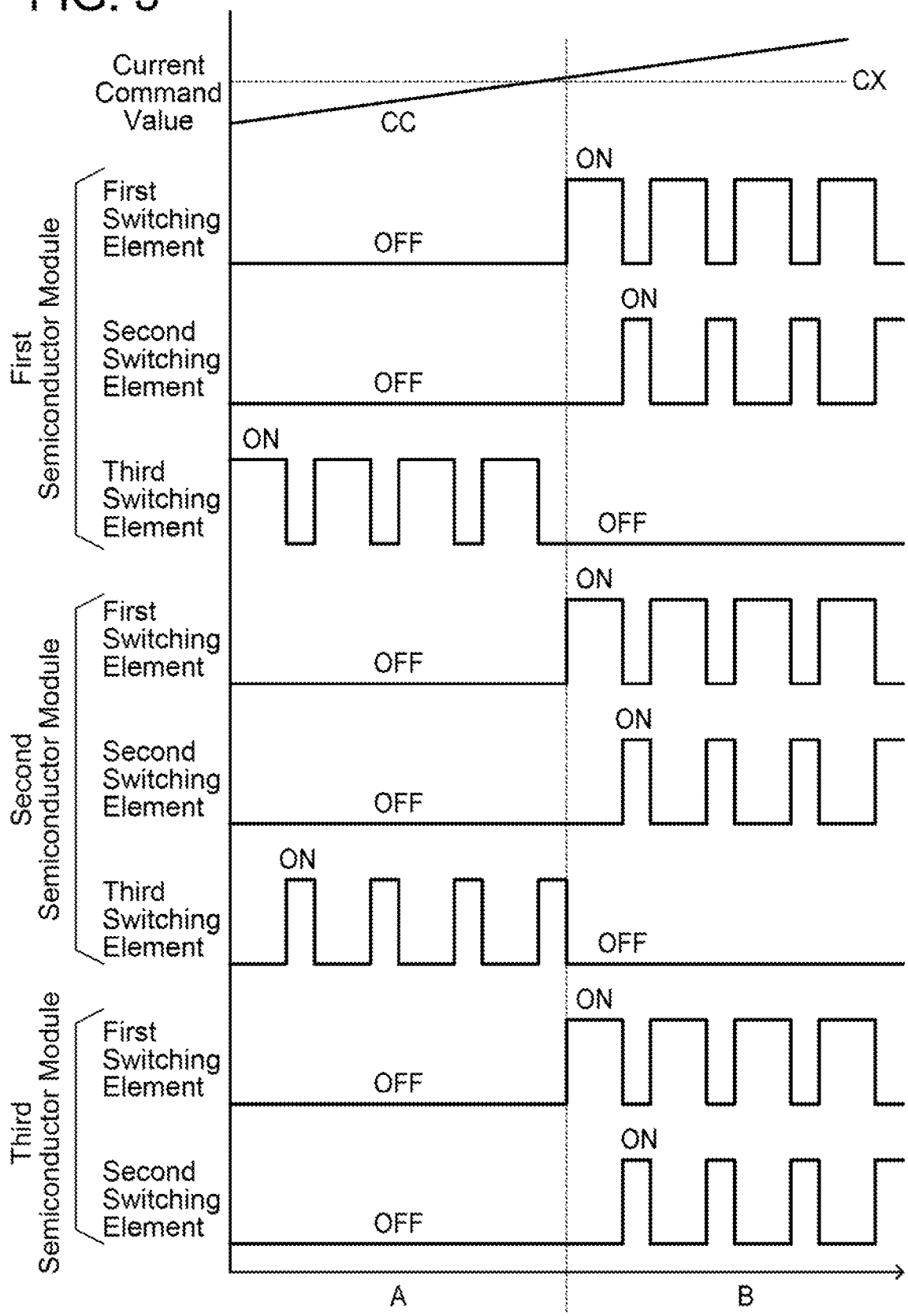
FIG. 3 is a timing chart for explaining a first switching control and a second switching control.
Figure 4:
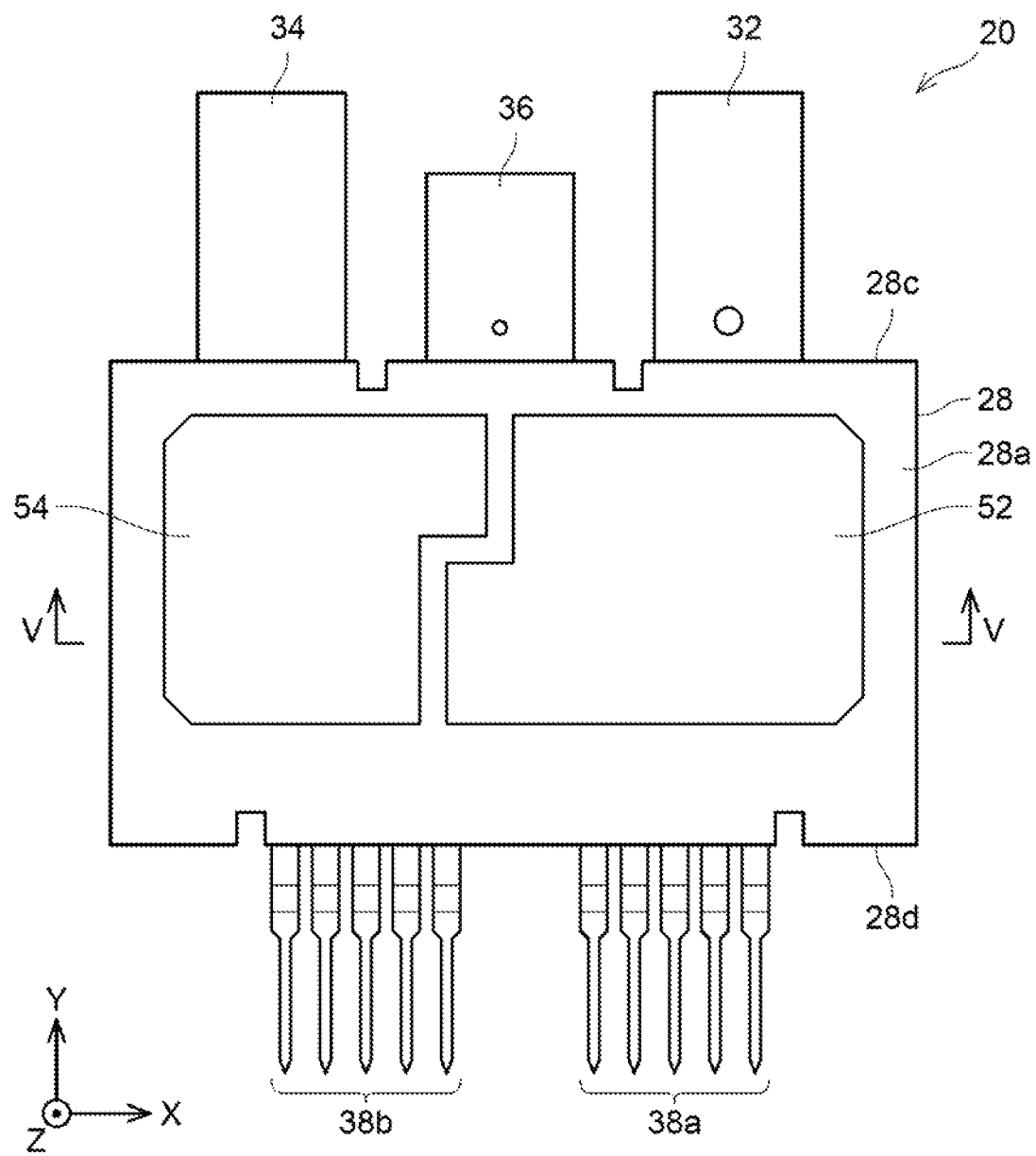
FIG. 4 is a plan view showing an outer appearance of a first semiconductor module 20.
Figure 5:
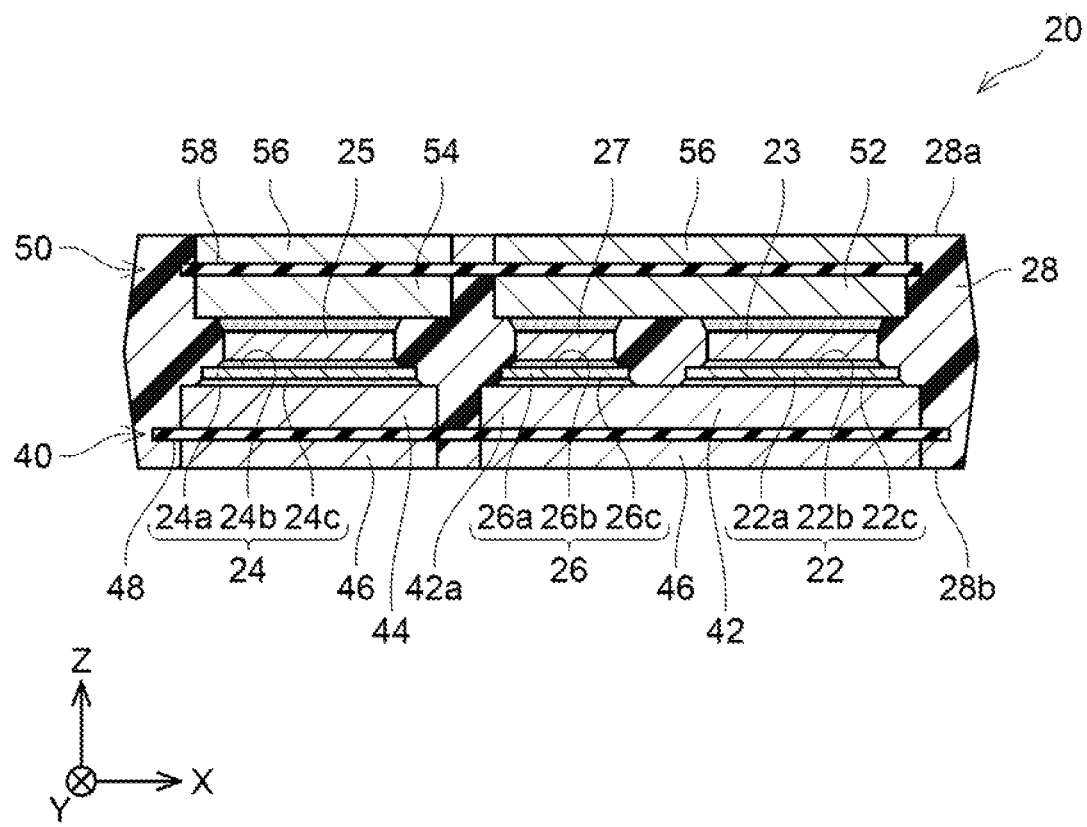
FIG. 5 is a cross-sectional view taken along a line V-V in FIG. 4 and schematically shows an internal structure of the first semiconductor module 20.
Figure 6:
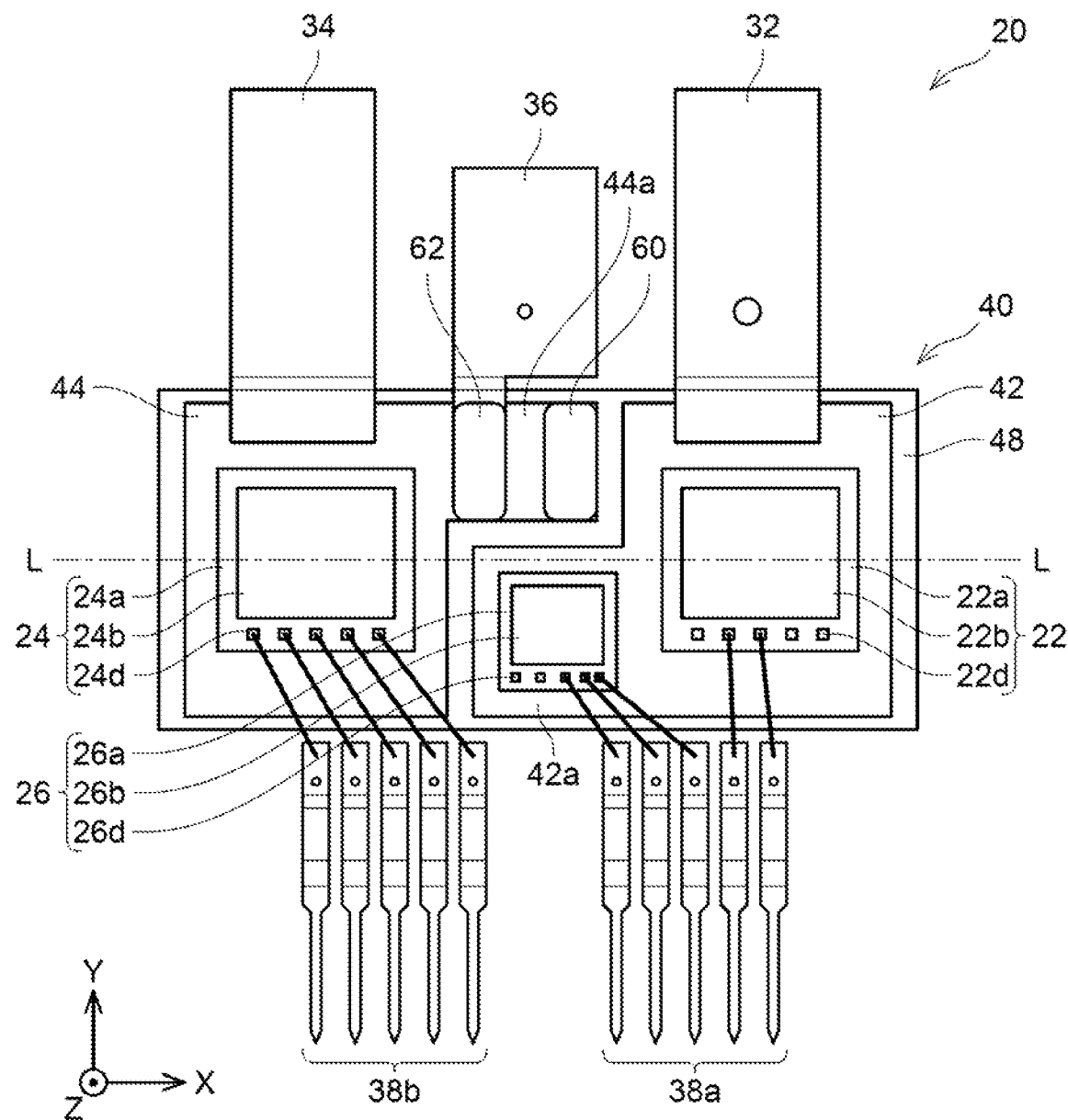
FIG. 6 is a plan view showing the internal structure of the first semiconductor module 20. In detail.
Figure 7:
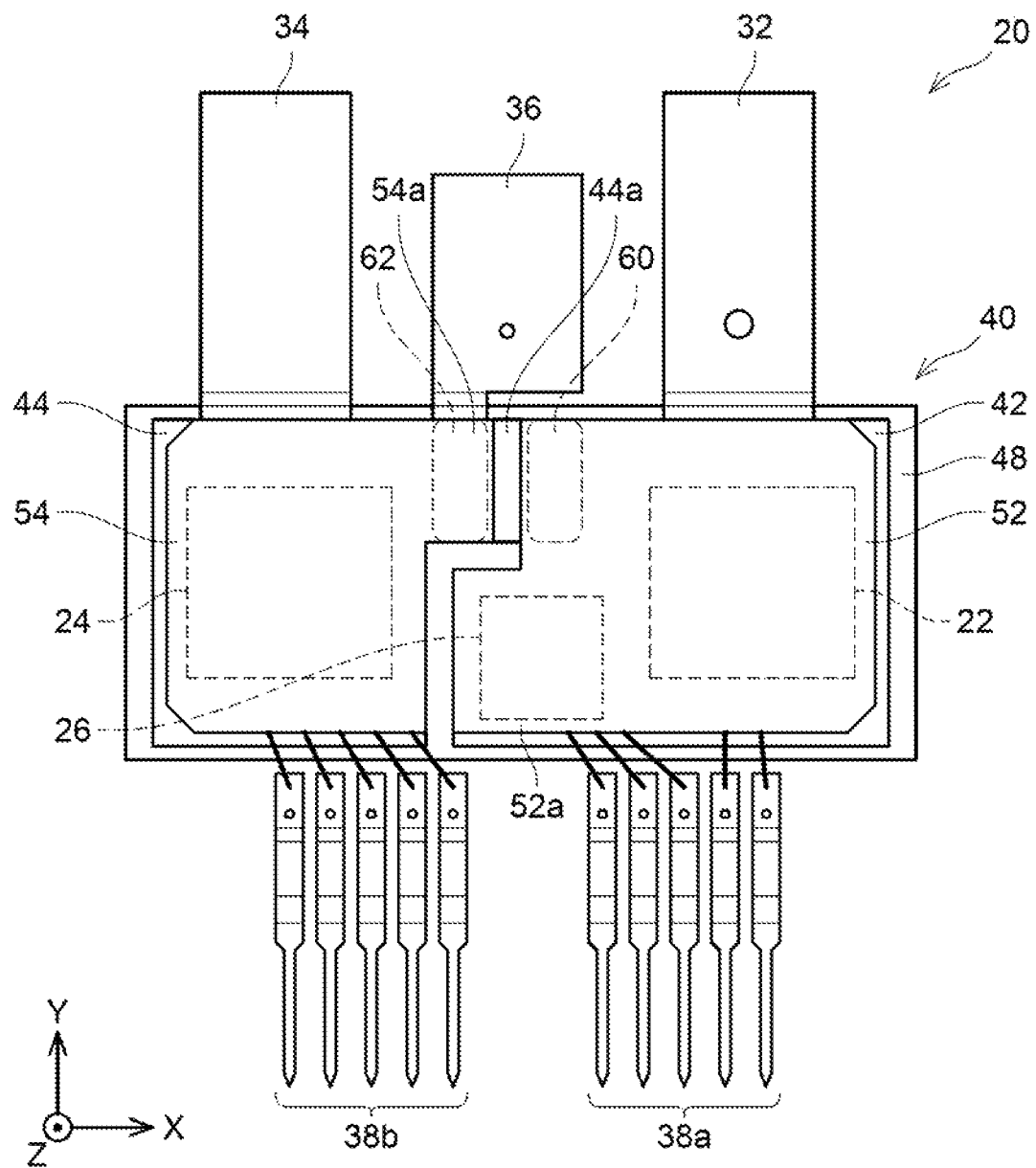
FIG. 7 is a diagram with a second conductor plate 52 and a fourth conductor plate 54 added to the plan view shown in FIG. 6.
Figure 8:
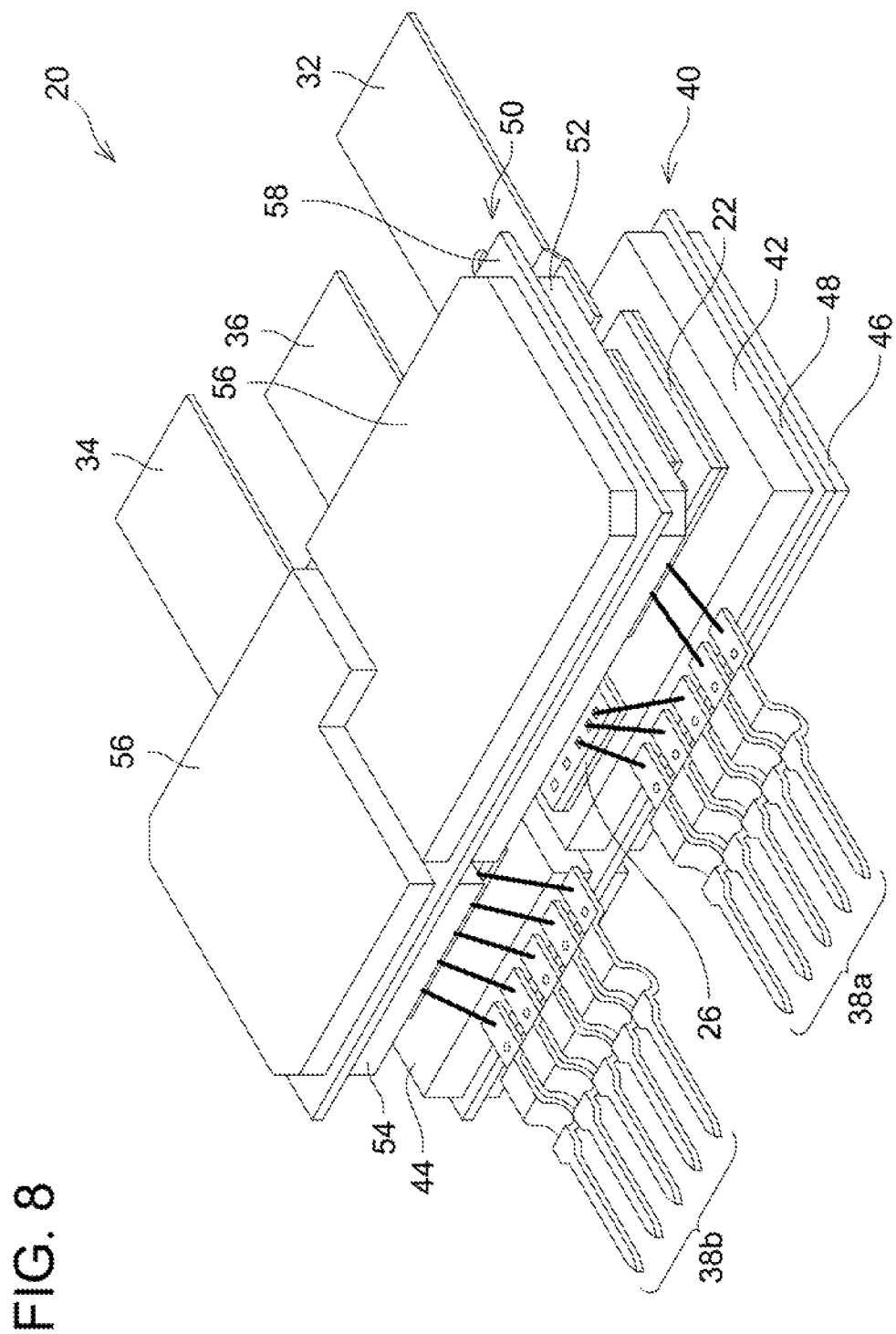
FIG. 8 is a perspective view of the first semiconductor module 20. Illustration of the encapsulant 28 is omitted.
Figure 9:
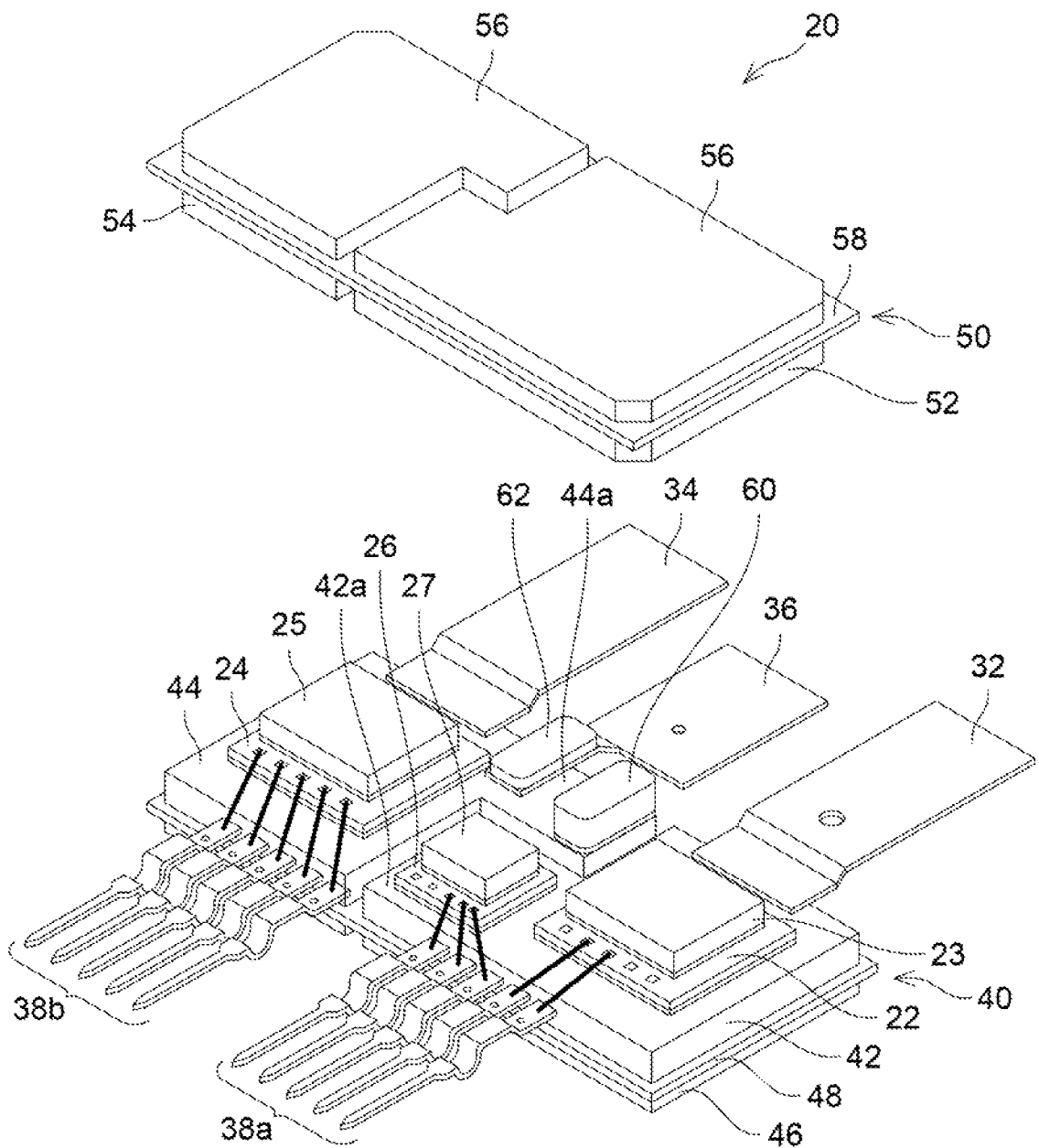
FIG. 9 is a perspective view of the first semiconductor module 20. Illustration of the encapsulant 28 is omitted and the second insulated circuit substrate 50 is upwardly detached.

Next, referring to FIG. 3, the controller 18 will be described. The controller 18 is configured to control the operations of the U-phase switching circuit 12, the V-phase switching circuit 14, and the W-phase switching circuit 16 to convert the DC power from the DC power source 2 to three-phase AC power to be supplied to the motor 4. For the conversion, the controller 18 selectively performs a first switching control and a second switching control in accordance with a current command value CC. More specifically, the first switching control is performed in a period (A) during which the current command value CC is lower than a threshold value CX, and the second switching control is performed in a period (B) during which the current command value CC is higher than the threshold value CX.

Under the first switching control, the third switching elements 26 and 76 of the first semiconductor modules 20 and the second semiconductor modules 70 are driven in a complementary manner, and the other switching elements 22, 24, 72, 74, 122 and 124 are not driven. That is, only the switching elements 26 and 76 constituted of silicon carbide are driven. Since only the third switching elements 26 of the semiconductor modules 20 and only the third switching elements 76 of the semiconductor modules 70 are driven under the first switching control, an increase in the temperatures of the semiconductor modules 20 and 70 is suppressed.

Under the second switching control, the first switching elements 22, 72 and 122 of the first semiconductor modules 20, the second semiconductor modules 70, and the third semiconductor modules 120, and the second switching elements 24, 74 and 124 of the first semiconductor modules 20, the second semiconductor modules 70 and the third semiconductor modules 120 are driven in the complementary manner. That is, only the switching elements 22, 24, 72, 74, 122 and 124 constituted of silicon are driven. Thus, under the second switching control, a large number of switching elements 22, 24, 72, 74, 122 and 124 are driven in response to the relatively large current command value CC. Under the second switching control, the number of driven switching elements 22, 24, 72, 74, 122 and 124 may be changed depending on the current command value CC.

Next, referring to FIGS. 4 to 10, the configuration of each first semiconductor module 20 will be described. The first semiconductor module 20 includes the plurality of switching elements 22, 24 and 26 and an encapsulant 28 that encapsulates these switching elements 22, 24 and 26. As described above, the plurality of switching elements 22, 24 and 26 includes the first switching element 22, the second switching element 24, and the third switching element 26. Each of the switching elements 22, 24 and 26 is a power semiconductor element, such as a MOSFET or an IGBT. The encapsulant 28 is constituted of a resin such as an epoxy resin, although not particularly limited so. The encapsulant 28 of the present embodiment has substantially a plate shape and includes an upper surface 28a and a lower surface 28b located opposite to the upper surface 28a. The encapsulant 28 further includes a first end surface 28c that is adjacent to the upper surface 28a and the lower surface 28b and a second end surface 28d that is adjacent to the upper surface 28a and the lower surface 28b and is located opposite to the first end surface 28c. The shape of the encapsulant 28 is not limited to the shape exemplified in the present embodiment and can be changed as appropriate.

The first semiconductor module 20 further includes the plurality of power terminals 32, 34 and 36 and a plurality of signal terminals 38a and 38b. The plurality of power terminals 32, 34 and 36 and the plurality of signal terminals 38a and 38b are constituted of a conductor such as copper or other metal. The plurality of power terminals 32, 34 and 36 includes the first power terminal 32, the second power terminal 34 and the third power terminal 36. The power terminals 32, 34 and 36 extend from the outside of the encapsulant 28 to the inside thereof and are electrically connected to the plurality of switching elements 22, 24 and 26 inside the encapsulant 28. The power terminals 32, 34 and 36 protrude from the first end surface 28c of the encapsulant 28 to the outside and extend in parallel with each other along the same plane.

The plurality of signal terminals 38a and 38b includes a plurality of first signal terminals 38a and a plurality of second signal terminals 38b. Each of the first signal terminals 38a extends from the outside of the encapsulant 28 to the inside thereof and is electrically connected to the first switching element 22 or the third switching element 26, inside the encapsulant 28. Each of the second signal terminals 38b extends from the outside of the encapsulant 28 to the inside thereof and is electrically connected to the second switching element 24, inside the encapsulant 28. Here, the signal terminals 38a and 38b may be connected to the switching elements 22, 24 and 26 via bonding wires or may be connected thereto directly without any bonding wire. The plurality of signal terminals 38a and 38b protrudes from the second end surface 28d of the encapsulant 28 to the outside and extends in parallel with each other along the same plane. The plurality of signal terminals 38a and 38b is connected to a connector (not shown) of the controller 18.

The first switching element 22 includes a semiconductor substrate 22a, an upper electrode 22b, a lower electrode 22c, and a plurality of signal electrodes 22d. The semiconductor substrate 22a of the first switching element 22 is a silicon substrate, although not particularly limited so. Each of the upper electrode 22b, the lower electrode 22c, and the plurality of signal electrodes 22d is constituted of a conductor such as metal. The upper electrode 22b and the plurality of signal electrodes 22d are located on an upper surface of the semiconductor substrate 22a, while the lower electrode 22c is located on a lower surface of the semiconductor substrate 22a. The first switching element 22 is a vertical semiconductor element that includes a pair of the electrodes 22b and 22c with the semiconductor substrate 22a interposed therebetween. As described above, the first switching element 22 of the present embodiment is an RC-IGBT, and thus has an IGBT structure and a diode structure inside the semiconductor substrate 22a. The upper electrode 22b is connected to an emitter of the IGBT structure and an anode of the diode structure, while the lower electrode 22c is connected to a collector of the IGBT structure and a cathode of the diode structure.

Figure 10A:
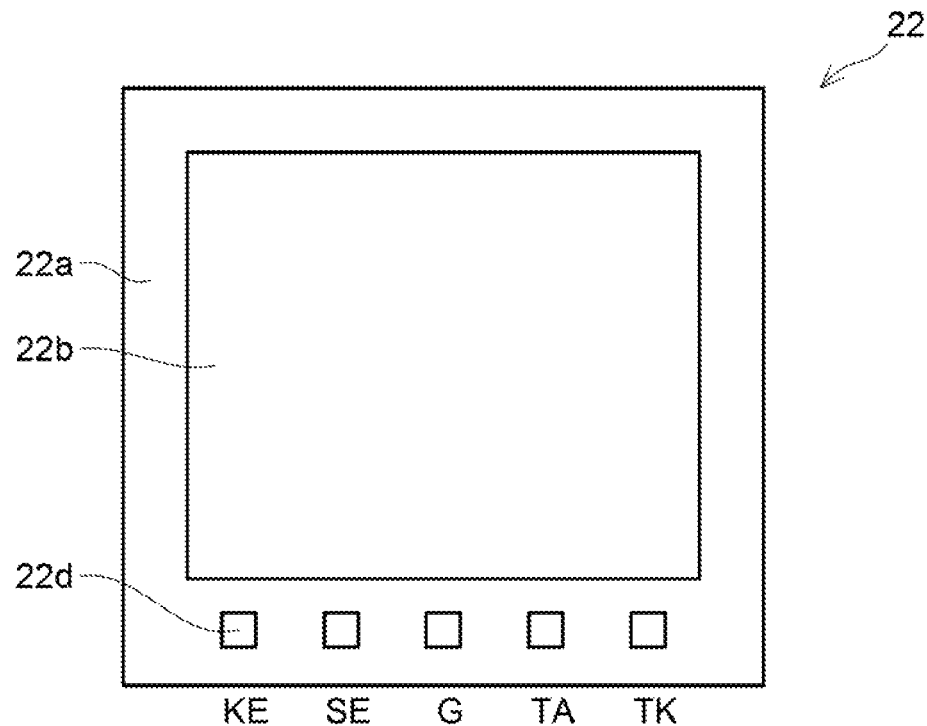
FIG. 10A shows an arrangement of a plurality of signal electrodes 22*d* of a first switching element 22.

As shown in FIG. 10A, the plurality of signal electrodes 22d of the first switching element 22 includes a Kelvin emitter pad KE, a sense emitter pad SE, a gate pad G, and a pair of temperature sense pads TA and TK. The Kelvin emitter pad KE outputs a signal that indicates a voltage of the emitter of the IGBT structure (or the upper electrodes 22b). The sense emitter pad SE outputs a signal that indicates a current passing through the IGBT structure. The gate pad G is connected to a gate of the IGBT structure. The pair of temperature sense pads TA and TK outputs a signal that indicates a temperature of the first switching element 22. In the first switching element 22, only the sense emitter pad SE and the gate pad G among these signal electrodes 22d are connected to their corresponding first signal terminals 38a. The types and the number of the signal electrodes 22d are not particularly limited, and various changes can be made thereto.

The second switching element 24 has the same configuration as the first switching element 22. That is, the second switching element 24 includes a semiconductor substrate 24a, an upper electrode 24b, a lower electrode 24c, and a plurality of signal electrodes 24d. It should be noted that the plurality of signal electrodes 24d of the second switching element 24 is connected to the plurality of second signal terminals 38b. The other configurations of the second switching element 24 can be understood with reference to the above description for the first switching element 22, and therefore a duplicate description is omitted.

The third switching element 26 includes a semiconductor substrate 26a, an upper electrode 26b, a lower electrode 26c and a plurality of signal electrodes 26d. The semiconductor substrate 26a of the third switching element 26 is a silicon carbide substrate, and its size is smaller than the size of the semiconductor substrate 22a of the first switching element 22, although not particularly limited so. Each of the upper electrode 26b, the lower electrode 26c, and the plurality of signal electrodes 26d is constituted of a conductor such as metal. The upper electrode 26b and the plurality of signal electrodes 26d are located on an upper surface of the semiconductor substrate 26a, while the lower electrode 26c is located on a lower surface of the semiconductor substrate 26a. Similar to the first switching element 22, the third switching element 26 is a vertical semiconductor element that includes a pair of electrodes 26b and 26c with the semiconductor substrate 26a interposed therebetween. As described above, the third switching element 26 of the present embodiment is a MOSFET, and thus includes a MOSFET structure inside the semiconductor substrate 26a. The upper electrode 26b is connected to a source of the MOSFET structure, while the lower electrode 26c is connected to a drain of the MOSFET structure.

Figure 10B:
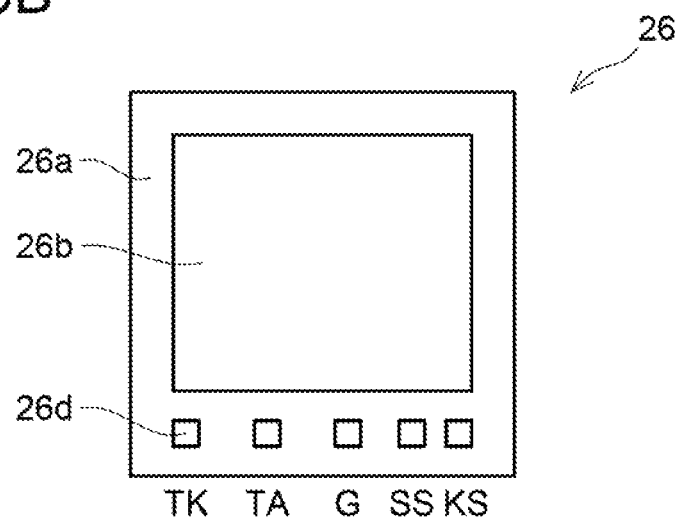
FIG. 10B shows an arrangement of a plurality of signal electrodes 26*d* of a third switching element 26.
Figure 11:
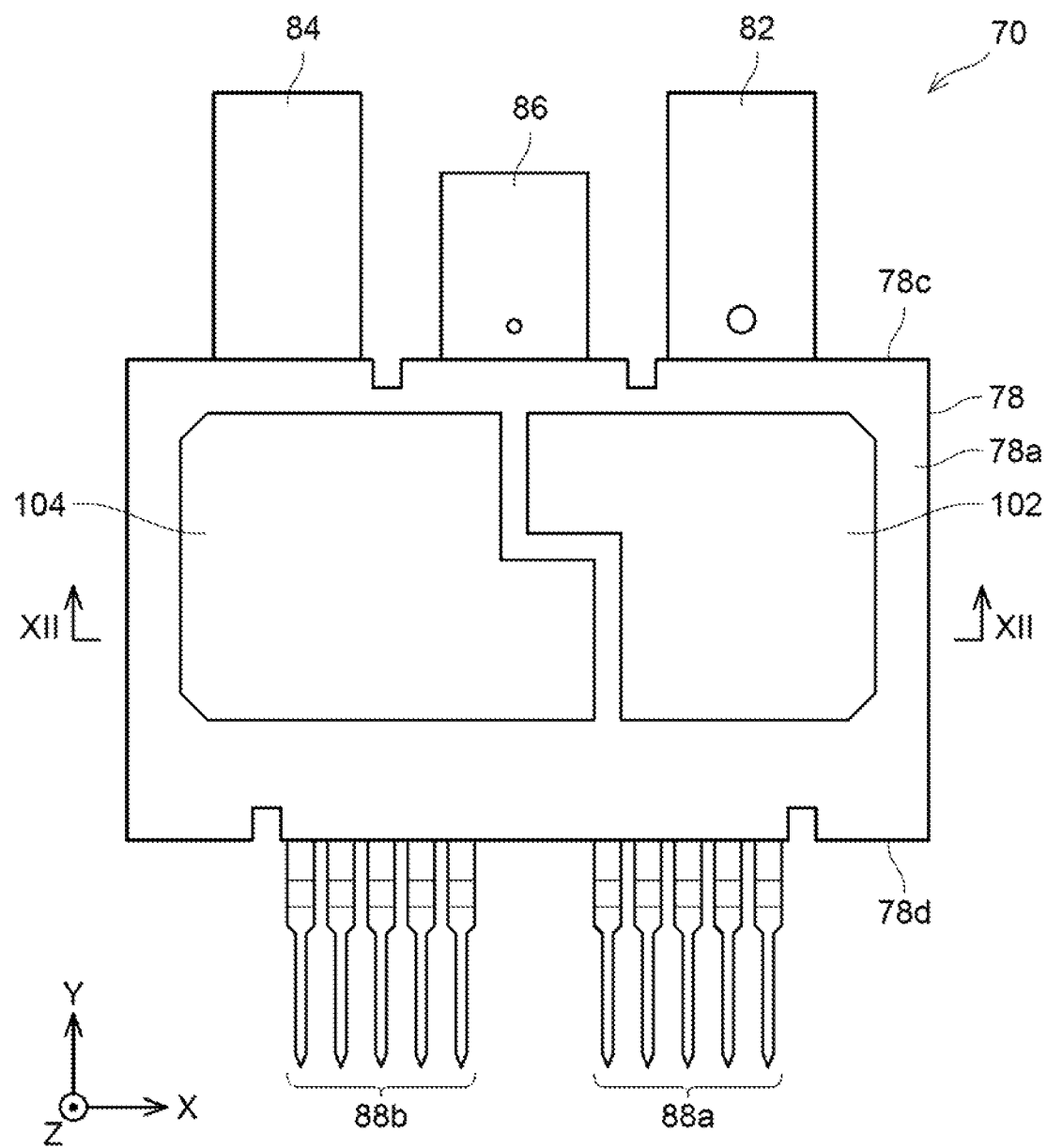
FIG. 11 is a plan view showing an outer appearance of a second semiconductor module 70.
Figure 12:
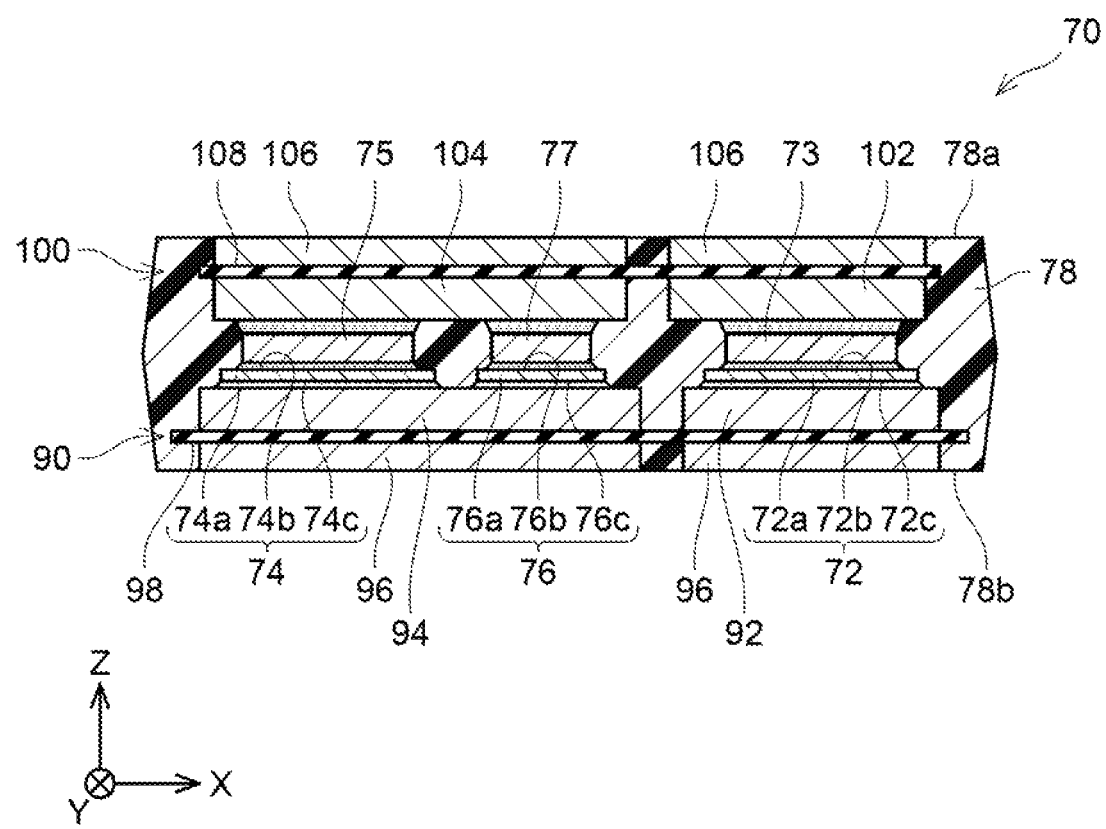
FIG. 12 is a cross-sectional view taken along a line XII-XII in FIG. 11 and schematically shows an internal structure of the second semiconductor module 70.
Figure 13:
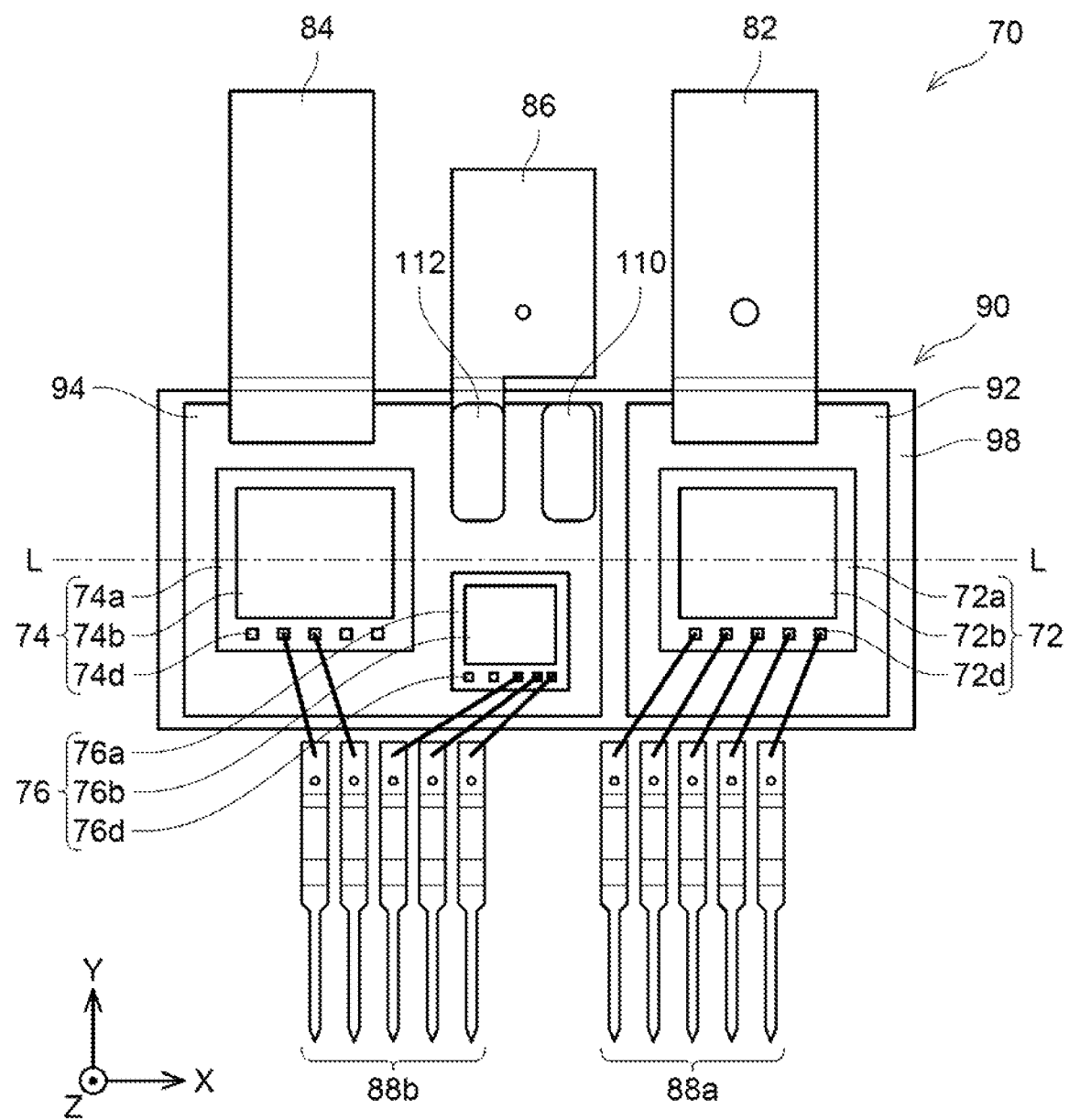
FIG. 13 is a plan view showing the internal structure of the second semiconductor module 70.
Figure 14:
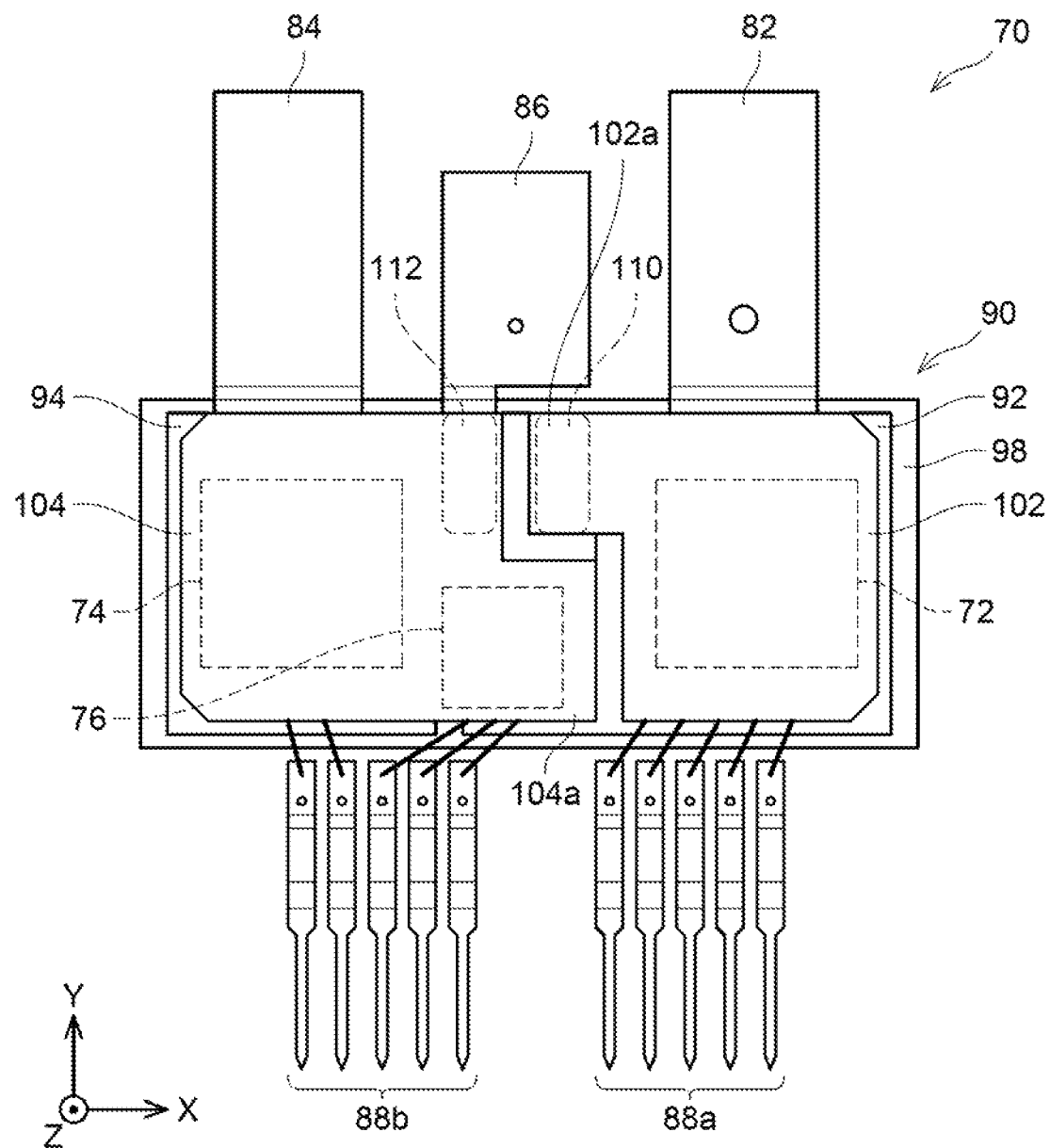
FIG. 14 is a diagram with a second conductor plate 102 and a fourth conductor plate 104 added to the plan view shown in FIG. 13.
Figure 15:
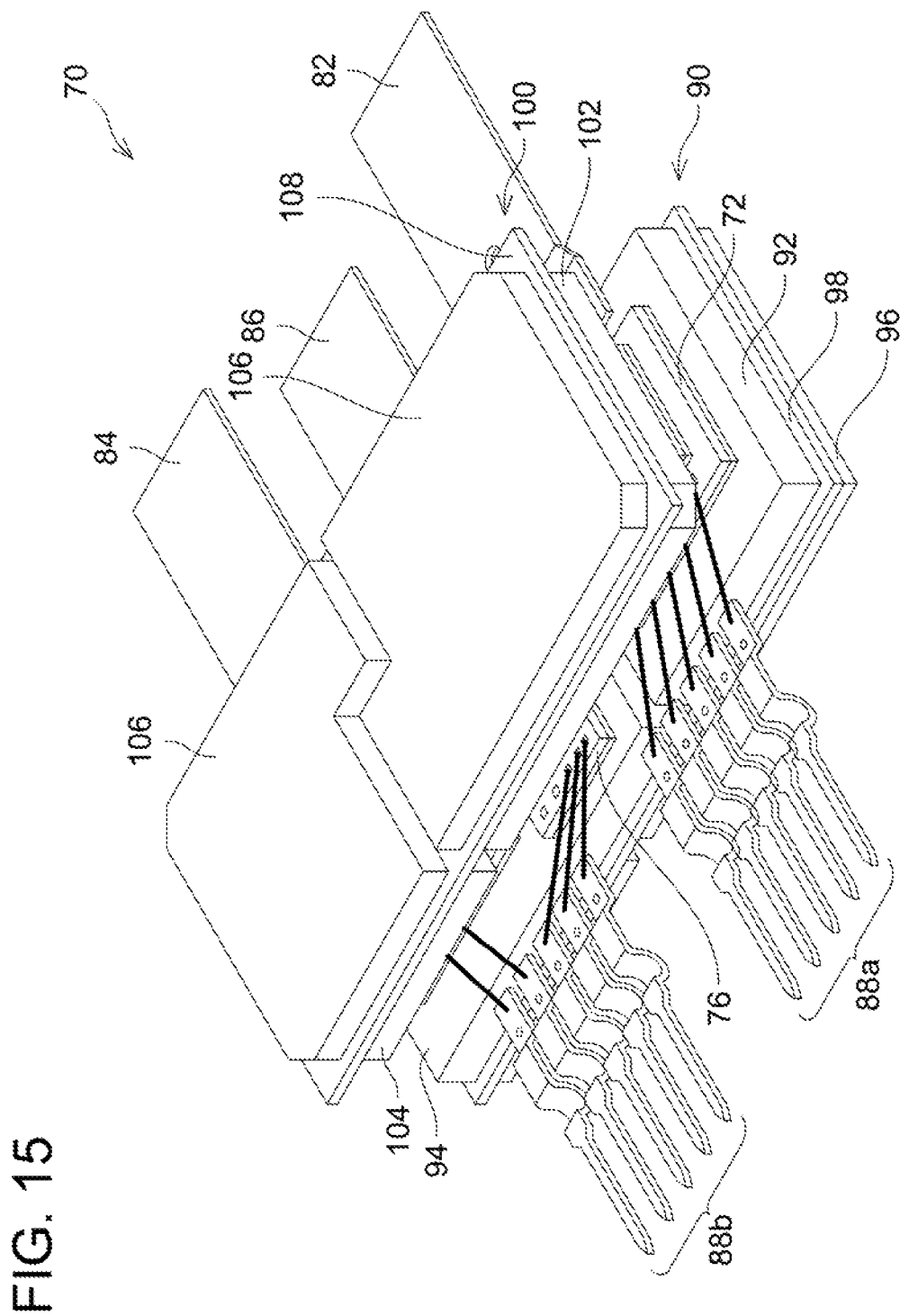
FIG. 15 is a perspective view of the second semiconductor module 70. Illustration of the encapsulant 78 is omitted.
Figure 16:
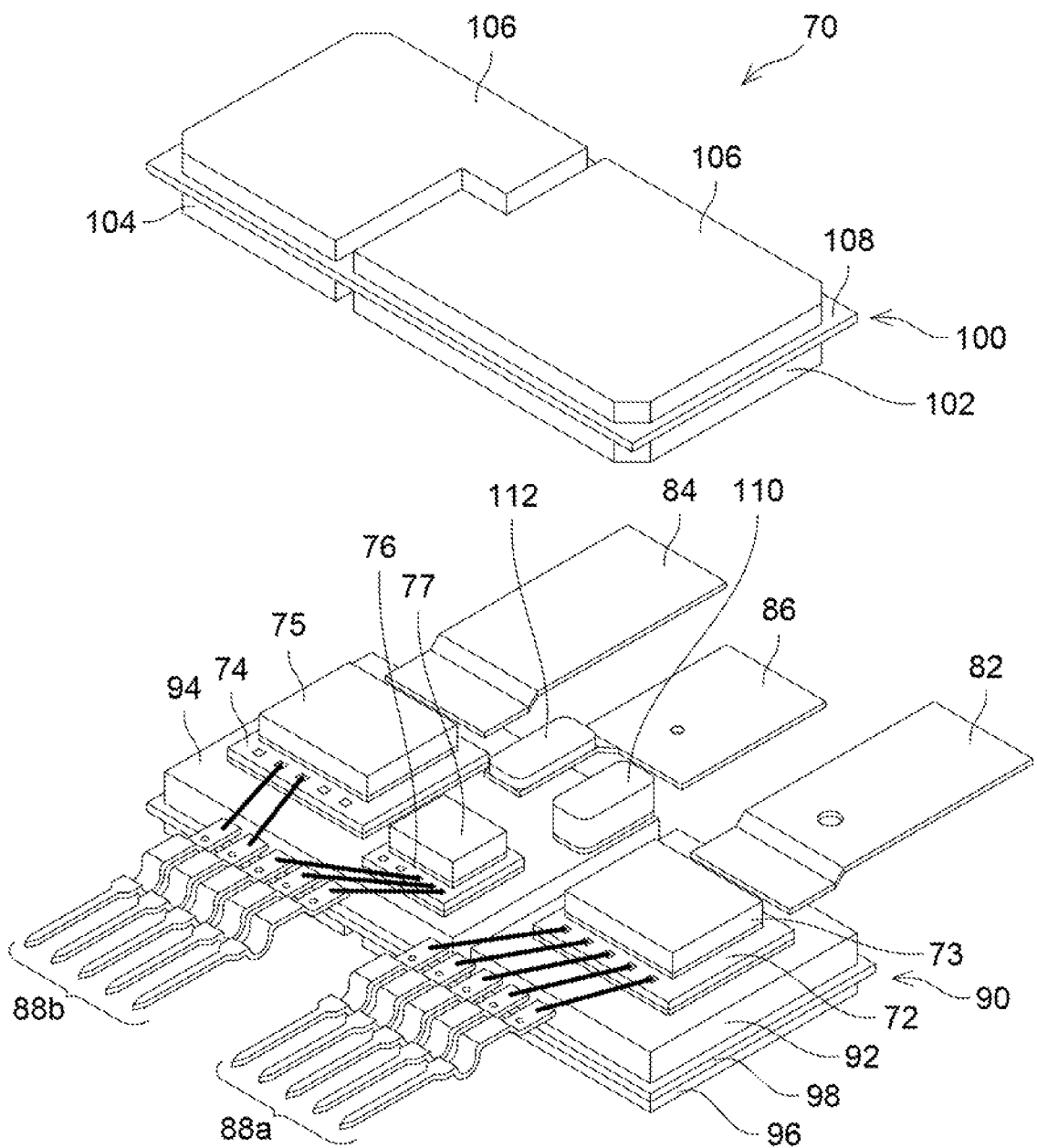
FIG. 16 is a perspective view of the second semiconductor module 70. Illustration of the encapsulant 78 is omitted and a second insulated circuit substrate 100 is upwardly detached.

As shown in FIG. 10B, the plurality of signal electrodes 26d of the third switching element 26 includes a Kelvin source pad KS, a sense source pad SS, a gate pad G, and a pair of temperature sense pads TA and TK. The Kelvin source pad KS outputs a signal that indicates a voltage of the source of the MOSFET structure (or the upper electrode 24b). The sense source pad SS outputs a signal that indicates a current passing through the MOSFET structure. The gate pad G is connected to a gate of the MOSFET structure. The pair of temperature sense pads TA and TK outputs a signal that indicates a temperature of the third switching element 26. In the third switching element 26, only the sense source pad SS, the Kelvin source pad KS, and the gate pad G among these signal electrodes 22d are connected to their corresponding first signal terminals 38a. The types and the number of the signal electrodes 26d are not particularly limited, and various changes can be made thereto.

The first semiconductor module 20 further includes a first insulated circuit substrate 40 and a second insulated circuit substrate 50. The first insulated circuit substrate 40 includes an insulated substrate 48, inner conductor plates 42 and 44 provided on one surface of the insulated substrate 48, and an outer conductor plate 46 provided on another surface of the insulated substrate 48. The insulated substrate 48 is constituted of an insulator, for example, ceramic. Each of the inner conductor plates 42 and 44 and the outer conductor plate 46 is constituted of a conductor, for example, copper or other metal. The inner conductor plates 42 and 44 are located inside the encapsulant 28 and are electrically connected to one or more of the switching elements 22, 24 and 26. The outer conductor plate 46 is electrically insulated from the inner conductor plates 42 and 44 and is exposed at the lower surface 28b of the encapsulant 28. The first insulated circuit substrate 40 also functions as a heat dissipating plate that dissipates heat of the switching elements 22, 24 and 26 to the outside of the encapsulant 28.

The second insulated circuit substrate 50 includes an insulated substrate 58, inner conductor plates 52 and 54 provided on one surface of the insulated substrate 58, and an outer conductor plate 56 provided on another surface of the insulated substrate 58. The insulated substrate 58 is constituted of an insulator, for example, ceramic. Each of the inner conductor plates 52 and 54 and the outer conductor plate 56 is constituted of a conductor, for example, copper or other metal. The inner conductor plates 52 and 54 are located inside the encapsulant 28 and are electrically connected to one or more of the switching elements 22, 24 and 26. The outer conductor plate 56 is electrically insulated from the inner conductor plates 52 and 54 and is exposed at the upper surface 28a of the encapsulant 28. The second insulated circuit substrate 50 also functions as a heat dissipating plate that dissipates heat of the switching elements 22, 24 and 26 to the outside of the encapsulant 28.

Each of the insulated circuit substrates 40 and 50 is, for example, an Active Metal Brazed Copper (AMC) substrate, a Direct Bonded Copper (DBC) substrate, or a Direct Bonded Aluminum (DBA) substrate, although not particularly limited so. The same applies to other insulated circuit substrates described herein.

The inner conductor plates 42 and 44 of the first insulated circuit substrate 40 include a first conductor plate 42 and a third conductor plate 44. The first conductor plate 42 and the third conductor plate 44 are located side by side along a first direction (direction parallel to an X-axis in the drawings). The inner conductor plates 52 and 54 of the second insulated circuit substrate 50 include a second conductor plate 52 and a fourth conductor plate 54. The second conductor plate 52 and the fourth conductor plate 54 are also located side by side along the first direction (X) and are opposed to the first conductor plate 42 and the third conductor plate 44, respectively. The first power terminal 32 is electrically connected to the first conductor plate 42, and the second power terminal 34 is electrically connected to the third conductor plate 44. The second power terminal 34 may be electrically connected to the second conductor plate 52, instead of the third conductor plate 44. The third power terminal 36 is electrically connected to the fourth conductor plate 54.

The first switching element 22 and the third switching element 26, which are the upper arm switching elements, are disposed on the first conductor plate 42. The lower electrode 22c of the first switching element 22 and the lower electrode 26c of the third switching element 26 are joined to the first conductor plate 42, for example, by soldering. The second conductor plate 52 is opposed to the first conductor plate 42 with the first switching element 22 and the third switching element 26 interposed therebetween. The upper electrode 22b of the first switching element 22 and the upper electrode 26b of the third switching element 26 are joined to the second conductor plate 52, for example, by soldering.

A conductor spacer 23 may be provided between the second conductor plate 52 (or the first conductor plate 42) and the switching element 22, and a conductor spacer 27 may be provided between the second conductor plate 52 (or the first conductor plate 42) and the switching element 26, as needed. In this case, the conductor spacer 23 for the first switching element 22 and the conductor spacer 27 for the third switching element 26 may have different structures and/or be constituted of different materials. Since the first switching element 22 and the third switching element 26 are constituted of different semiconductor materials, they differ from each other in mechanical properties, such as Young's modulus and linear expansion coefficient. Therefore, the conductor spacers 23 and 27, which are joined to the respective switching elements 22 and 26, may be given different mechanical properties by differentiating their structures and/or materials.

The second switching element 24, which is the lower arm switching element, is disposed on the third conductor plate 44. The lower electrode 24c of the second switching element 24 is joined to the third conductor plate 44, for example, by soldering. The fourth conductor plate 54 is opposed to the third conductor plate 44 with the second switching element 24 interposed therebetween. The upper electrode 24b of the second switching element 24 is joined to the fourth conductor plate 54, for example, by soldering. A conductor spacer 25 may be provided between the fourth conductor plate 54 (or the third conductor plate 44) and the second switching element 24, as needed. In this case, the conductor spacer 25 for the second switching element 24 and the conductor spacer 27 for the third switching element 26 may have different structures and/or may be constituted of different materials.

Here, in the first insulated circuit substrate 40, the outer conductor plate 46 is divided into a plurality of conductor plates, corresponding to the plurality of divided inner conductor plates 42 and 44. Due to this, warpage of the first insulated circuit substrate 40 caused by its thermal deformation can be suppressed. Similarly, also in the second insulated circuit substrate 50, the outer conductor plate 56 is divided into a plurality of conductor plates, corresponding to the plurality of divided inner conductor plates 52 and 54. Due to this, warpage of the second insulated circuit substrate 50 caused by its thermal deformation can be suppressed.

The first semiconductor module 20 further includes a first coupling portion 60 and a second coupling portion 62. The first coupling portion 60 electrically connects between the second conductor plate 52 and the third conductor plate 44, inside the encapsulant 28. The first coupling portion 60 is constituted of a conductor such as copper or other metal. The first coupling portion 60 is located between the second conductor plate 52 and the third conductor plate 44 and is joined to each of the conductor plates 44 and 52, for example, by soldering. The first coupling portion 60 may be integrally formed with the second conductor plate 52 or the third conductor plate 44. Alternatively, the first coupling portion 60 may be constituted of a solder or other joint material only.

The second coupling portion 62 electrically connects between the fourth conductor plate 54 and the third power terminal 36, inside the encapsulant 28. The second coupling portion 62 is constituted of a conductor such as copper or other metal. The second coupling portion 62 is located between the fourth conductor plate 54 and the third power terminal 36 and is joined to the fourth conductor plate 54 and the third power terminal 36, for example, by soldering. The second coupling portion 62 may be integrally formed with the fourth conductor plate 54 and/or the third power terminal 36. Alternatively, the second coupling portion 62 may be constituted of a solder or other joint material only.

In the first semiconductor module 20 with the configuration described above, the first switching element 22 and the second switching element 24 are arranged along the first direction (X). Then, the third switching element 26 is located between the first switching element 22 and the second switching element 24 with respect to the first direction (X). According to this configuration, the switching element 26, which has the different configuration from the switching elements 22 and 24, is disposed between the two switching elements 22 and 24 having the same configuration, by which structural symmetry of the first semiconductor module 20 can be enhanced. In particular, the third switching element 26 constituted of silicon carbide has different mechanical properties, such as Young's modulus and linear expansion coefficient, from the first switching element 22 and the second switching element 24 constituted of silicon. Disposing such third switching element 26 between the first switching element 22 and the second switching element 24 homogenizes stress and heat distribution generated inside the first semiconductor module 20.

In the first semiconductor module 20 of the present embodiment, in a plan view perpendicular to the first conductor plate 42 (see FIG. 6), the center of the third switching element 26 is offset from a straight line L that passes through the respective centers of the first switching element 22 and the second switching element 24. That is, the third switching element 26 is offset with respect to the arrangement of the first switching element 22 and the second switching element 24. Then, the first coupling portion 60 and the second coupling portion 62 are also located between the first switching element 22 and the second switching element 24 with respect to the first direction (X). Such a configuration allows the size of the first semiconductor module 20 to be reduced, since the third switching element 26 is smaller in size than the first switching element 22 and the second switching element 24.

In the first semiconductor module 20 of the present embodiment, the first coupling portion 60 and the second coupling portion 62 are located on the same side relative to the third switching element 26 with respect to a second direction (Y) that is parallel to the first conductor plate 42 and perpendicular to the first direction (X). With such a configuration, the first coupling portion 60 and the second coupling portion 62 are adjacent to each other, so a current pathway in the first semiconductor module 20 can be shortened. Further, in the plan view perpendicular to the first conductor plate 42 (see FIG. 6), the first coupling portion 60 and the second coupling portion 62 each extend along the second direction (Y) and are adjacent to each other in the first direction (X). With such a configuration, an interval between the first conductor plate 42 and the third conductor plate 44 and an interval between the second conductor plate 52 and the fourth conductor plate 54 can be increased, and thus insulation between these conductor plates 42, 44, 52 and 54 can be enhanced.

In the first semiconductor module 20 of the present embodiment, the first conductor plate 42 includes a first protrusion 42a protruding toward the third conductor plate 44 along the first direction (X). Then, the third switching element 26 is disposed on the first protrusion 42a. By partly enlarging the first conductor plate 42 corresponding to the size of the third switching element 26, the size of the first semiconductor module 20 can be reduced. In the present embodiment, an entirety of the third switching element 26 is disposed on the first protrusion 42a of the first conductor plate 42. However, as another embodiment, only a part of the third switching element 26 may be disposed on the first protrusion 42a of the first conductor plate 42.

In addition, the second conductor plate 52 includes a second protrusion 52a that protrudes toward the fourth conductor plate 54 along the first direction (X) and is opposed to the first protrusion 42a. A part of or an entirety of the second protrusion 52a is opposed to the first protrusion 42a with the third switching element 26 interposed therebetween. As described, the second protrusion 52a can be provided in the second conductor plate 52 to correspond to the first protrusion 42a of the first conductor plate 42.

In the first semiconductor module 20 of the present embodiment, the third conductor plate 44 includes a third protrusion 44a protruding toward the first conductor plate 42 along the first direction (X). The third protrusion 44a is adjacent to the first protrusion 42a in the second direction (Y) perpendicular to the first direction (X). Then, the third conductor plate 44 is electrically connected to the second conductor plate 52 at the third protrusion 44a. That is, the first coupling portion 60 is located at the third protrusion 44a of the third conductor plate 44. With such a configuration, the size of the first semiconductor module 20 can be reduced.

In addition, the fourth conductor plate 54 may include a fourth protrusion 54a that protrudes toward the second conductor plate 52 along the first direction (X) and is at least partly opposed to the third protrusion 44a. In this case, the fourth conductor plate 54 is electrically connected to the third power terminal 36 at the fourth protrusion 54a. That is, the second coupling portion 62 is located at the fourth protrusion 54a of the fourth conductor plate 54. With such a configuration, the size of the first semiconductor module 20 can be further reduced.

In the first semiconductor module 20 of the present embodiment, the first conductor plate 42 and the third conductor plate 44 are provided at the first insulated circuit substrate 40, and the second conductor plate 52 and the fourth conductor plate 54 are provided at the second insulated circuit substrate 50. However, the first conductor plate 42 and the third conductor plate 44 each may be constituted of an independent metal plate, for example, a copper plate, instead of the first insulated circuit substrate 40. Similarly, the second conductor plate 52 and the fourth conductor plate 54 each may be constituted of an independent metal plate, for example, a copper plate, instead of the second insulated circuit substrate 50. Specific configurations of the first conductor plate 42, the second conductor plate 52, the third conductor plate 44 and the fourth conductor plate 54 are not particularly limited, and various changes can be made thereto.

Next, referring to FIGS. 11 to 16, the configuration of each second semiconductor module 70 will be described. The second semiconductor module 70 includes the plurality of switching elements 72, 74 and 76 and an encapsulant 78 that encapsulates these switching elements 72, 74 and 76. As described above, the plurality of switching elements 72, 74 and 76 includes the first switching element 72, the second switching element 74, and the third switching element 76. Each of the switching elements 72, 74 and 76 is a power semiconductor element, such as a MOSFET or an IGBT. The encapsulant 78 is constituted of a resin, such as an epoxy resin, although not particularly limited so. The encapsulant 78 of the second semiconductor module 70 has the same shape as the encapsulant 28 of the first semiconductor module 20, and thus has an upper surface 78a, a lower surface 78b, a first end surface 78c, and a second end surface 78d. The shape of the encapsulant 78 is not limited to that exemplified in the present embodiment and can be changed as appropriate.

The second semiconductor module 70 further includes the plurality of power terminals 82, 84 and 86 and a plurality of signal terminals 88a and 88b. The plurality of power terminals 82, 84 and 86 includes the first power terminal 82, the second power terminal 84 and the third power terminal 86. The plurality of signal terminals 88a and 88b includes a plurality of first signal terminals 88a and a plurality of second signal terminals 88b. The plurality of power terminals 82, 84 and 86 protrudes from the first end surface 78c of the encapsulant 78 to the outside thereof, while the plurality of signal terminals 38a and 38b protrudes from the second end surface 78d of the encapsulant 78 to the outside. The plurality of power terminals 82, 84 and 86 and the plurality of signal terminals 88a and 88b in the second semiconductor module 70 have the same configurations and functions as the plurality of power terminals 32, 34 and 36 and the plurality of signal terminals 38a and 38b in the first semiconductor module 20, respectively. Therefore, the details of the plurality of power terminals 82, 84 and 86 and the plurality of signal terminals 88a and 88b in the second semiconductor module 70 can be understood by referring to the description for the first semiconductor module 20 described above, and thus a duplicate description is omitted.

Each of the first switching element 72 and the second switching element 74 in the second semiconductor module 70 has the same configuration as the first switching element 22 of the first semiconductor module 20. Thus, the first switching element 72 and the second switching element 74 include semiconductor substrates 72a and 74a, upper electrodes 72b and 74b, lower electrodes 72c and 74c, and a plurality of signal electrodes 72d and 74d, respectively. Similarly, the third switching element 76 of the second semiconductor module 70 has the same configuration as the third switching element 26 of the first semiconductor module 20, and thus includes a semiconductor substrate 76a, an upper electrode 76b, a lower electrode 76c, and a plurality of signal electrodes 764. Therefore, the details of the switching elements 72, 74 and 76 in the second semiconductor module 70 can be understood by referring to the description for the first semiconductor module 20 described above, and thus a duplicate description is omitted.

The second semiconductor module 70 further includes a first insulated circuit substrate 90 and a second insulated circuit substrate 100. The first insulated circuit substrate 90 includes an insulated substrate 98, inner conductor plates 92 and 94 provided on one surface of the insulated substrate 98, and an outer conductor plate 96 provided on another surface of the insulated substrate 98. The insulated substrate 98 is constituted of an insulator, for example, ceramic. Each of the inner conductor plates 92 and 94 and the outer conductor plate 96 is constituted of a conductor, for example, copper or other metal. The inner conductor plates 92 and 94 are located inside the encapsulant 78 and are electrically connected to one or more of the switching elements 72, 74 and 76. The outer conductor plate 96 is electrically insulated from the inner conductor plates 92 and 94 and is exposed at the lower surface 78b of the encapsulant 78. Also in the second semiconductor module 70, the first insulated circuit substrate 90 functions as a heat dissipating plate that dissipates heat of the switching elements 72, 74 and 76 to the outside of the encapsulant 78.

The second insulated circuit substrate 100 includes an insulated substrate 108, inner conductor plates 102 and 104 provided on one surface of the insulated substrate 108, and an outer conductor plate 106 provided on another surface of the insulated substrate 108. The insulated substrate 108 is constituted of an insulator, for example, ceramic. Each of the inner conductor plates 102 and 104 and the outer conductor plate 106 is constituted of a conductor, for example, copper or other metal. The inner conductor plates 102 and 104 are located inside the encapsulant 78 and are electrically connected to one or more of the switching elements 72, 74 and 76. The outer conductor plate 106 is electrically insulated from the inner conductor plates 102 and 104 and is exposed at the upper surface 28a of the encapsulant 78. The second insulated circuit substrate 100 also functions as a heat dissipating plate that dissipates heat of the switching elements 72, 74 and 76 to the outside of the encapsulant 78.

The inner conductor plates 92 and 94 of the first insulated circuit substrate 90 include a first conductor plate 92 and a third conductor plate 94. The first conductor plate 92 and the third conductor plate 94 are located side by side along the first direction (the direction parallel to the X-axis in the drawings). The inner conductor plates 102 and 104 of the second insulated circuit substrate 100 include a second conductor plate 102 and a fourth conductor plate 104. The second conductor plate 102 and the fourth conductor plate 104 are located side by side along the first direction (X) and are opposed to the first conductor plate 92 and the third conductor plate 94, respectively. The first power terminal 82 is electrically connected to the first conductor plate 92, and the second power terminal 84 is electrically connected to the third conductor plate 94. The second power terminal 84 may be electrically connected to the second conductor plate 102, instead of the third conductor plate 94. The fourth conductor plate 54 is electrically connected to the third power terminal 36. These configurations are common with those of the first semiconductor module 20.

Only the first switching element 72 is disposed, as the upper arm switching element, on the first conductor plate 92 of the second semiconductor module 70. The lower electrode 72c of the first switching element 72 is joined to the first conductor plate 92, for example, by soldering. The second conductor plate 102 is opposed to the first conductor plate 92 with the first switching element 72 interposed therebetween. The upper electrode 72b of the first switching element 72 is joined to the second conductor plate 102, for example, by soldering. Also in the second semiconductor module 70, a conductor spacer 73 may be provided between the second conductor plate 102 (or the first conductor plate 92) and the first switching element 72, as needed.

The second switching element 74 and the third switching element 76 are disposed, as the lower arm switching elements, on the third conductor plate 94 of the second semiconductor module 70. The lower electrode 74c of the second switching element 74 and the lower electrode 76c of the third switching element 76 are joined to the third conductor plate 94, for example, by soldering. The fourth conductor plate 104 is opposed to the third conductor plate 94 with the second switching element 74 and the third switching element 76 interposed therebetween. The upper electrode 74b of the second switching element 74 and the upper electrode 76b of the third switching element 76 are joined to the fourth conductor plate 104, for example, by soldering. A conductor spacer 75 may be provided between the fourth conductor plate 104 (or the third conductor plate 94) and the switching element 74, and a conductor spacer 77 may be provided between the fourth conductor plate 104 (or the third conductor plate 94) and the switching element 76, as needed. In this case, the conductor spacer 77 for the third switching element 76 may have a different structure and/or may be constituted of a different material from the conductor spacers 73 and 75 for the first switching element 72 and the second switching element 74.

The second semiconductor module 70 further includes a first coupling portion 110 and a second coupling portion 112. The first coupling portion 110 electrically connects between the second conductor plate 102 and the third conductor plate 94, inside the encapsulant 78. The second coupling portion 112 electrically connects between the fourth conductor plate 104 and the third power terminal 86, inside the encapsulant 78. The first coupling portion 110 and the second coupling portion 112 in the second semiconductor module 70 have the same structures and functions as the first coupling portion 60 and the second coupling portion 62 in the first semiconductor module 20. The description for the first coupling portion 60 and the second coupling portion 62 in the above-described first semiconductor module 20 can be also applied to the first coupling portion 110 and the second coupling portion 112 in the second semiconductor module 70, unless otherwise mentioned. Thus, the duplicate description is omitted herein.

In the second semiconductor module 70 with the configuration described above, the first switching element 72 and the second switching element 74 are arranged along the first direction (X). Then, the third switching element 76 is located between the first switching element 72 and the second switching element 74 with respect to the first direction (X). This is the same as in the first semiconductor module 20, and thus stress and heat distribution generated inside the second semiconductor module 70 are also homogenized.

In the second semiconductor module 70, in a plan view perpendicular to the first conductor plate 92 (see FIG. 13), the center of the third switching element 76 is offset from a straight line L that passes through the respective centers of the first switching element 72 and the second switching element 74. That is, the third switching element 76 is offset with respect to the arrangement of the first switching element 72 and the second switching element 74. The first coupling portion 110 and the second coupling portion 112 are also located between the first switching element 72 and the second switching element 74 with respect to the first direction (X). With such a configuration, the size of the semiconductor module 70 can be reduced since the third switching element 76 is smaller in size than the first switching element 72 and the second switching element 74.

In the second semiconductor module 70, the first coupling portion 110 and the second coupling portion 112 are located on the same side relative to the third switching element 76 with respect to the second direction (Y). With such a configuration, the first coupling portion 110 and the second coupling portion 112 are adjacent to each other, so a current pathway in the second semiconductor module 70 can be shortened. Further, in the plan view perpendicular to the first conductor plate 92 (see FIG. 13), the first coupling portion 110 and the second coupling portion 112 each extend along the second direction (Y) and are adjacent to each other in the first direction (X). With such a configuration, an interval between the first conductor plate 92 and the third conductor plate 94 and an interval between the second conductor plate 102 and the fourth conductor plate 104 can be increased, and thus insulation between these conductor plates 92, 94, 102 and 104 can be enhanced.

In the second semiconductor module 70, the fourth conductor plate 104 includes a fourth protrusion 104a protruding toward the second conductor plate 102 along the first direction (X). A part of or an entirety of the fourth protrusion 104a is opposed to the third conductor plate 94 with the third switching element 76 interposed therebetween. By partly enlarging the fourth conductor plate 104 corresponding to the size of the third switching element 76, the size of the second semiconductor module 70 can be reduced. In addition, the second conductor plate 102 includes a second protrusion 102a protruding toward the fourth conductor plate 104 along the first direction (X). The second protrusion 102a is adjacent to the fourth protrusion 104a in the second direction (Y) perpendicular to the first direction (X). Then, the second conductor plate 102 is electrically connected to the third conductor plate 94 at the second protrusion 102a. That is, the first coupling portion 110 is located at the second protrusion 102a of the second conductor plate 102. With such a configuration, the size of the second semiconductor module 70 can be reduced.

Figure 17:
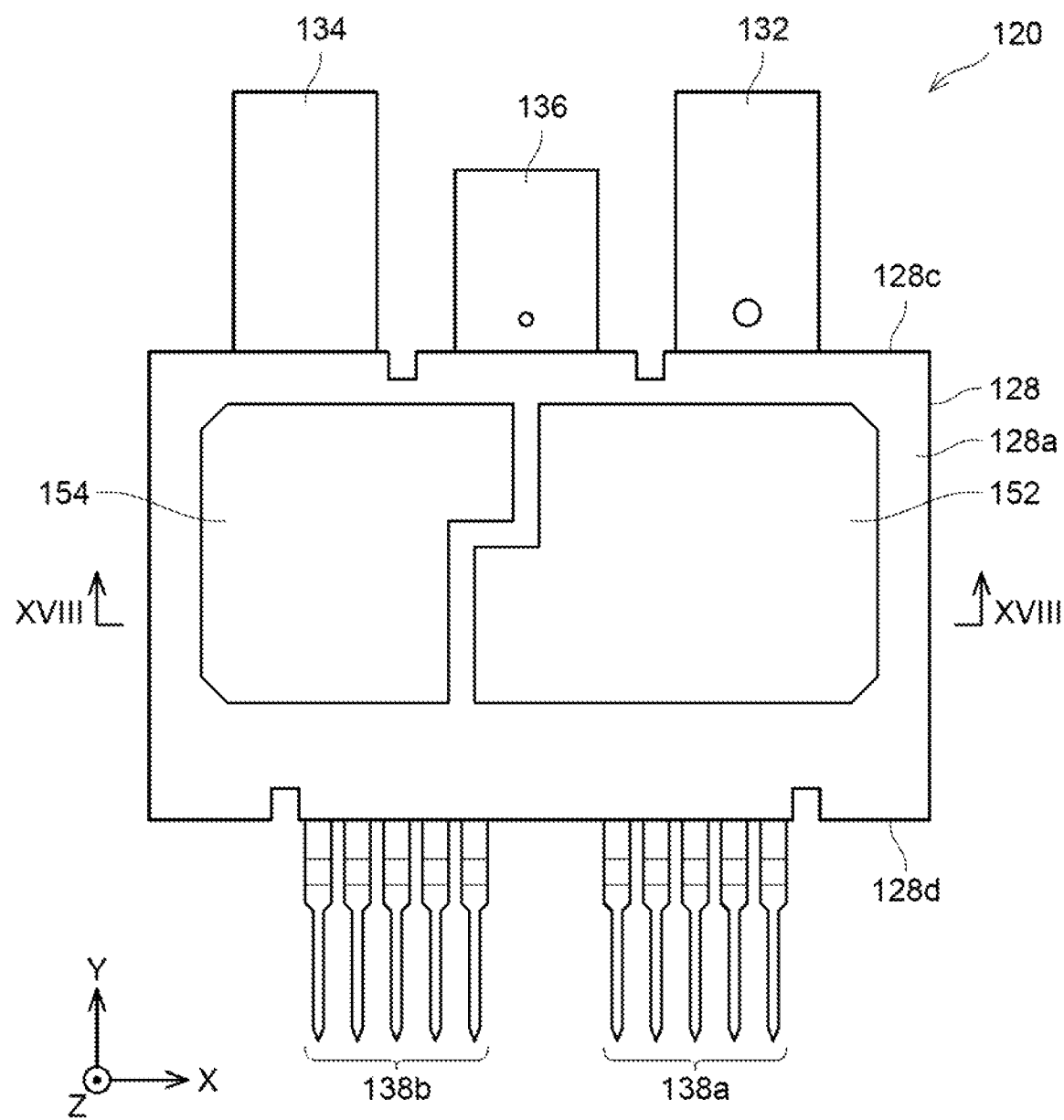
FIG. 17 is a plan view showing an outer appearance of a third semiconductor module 120.
Figure 18:
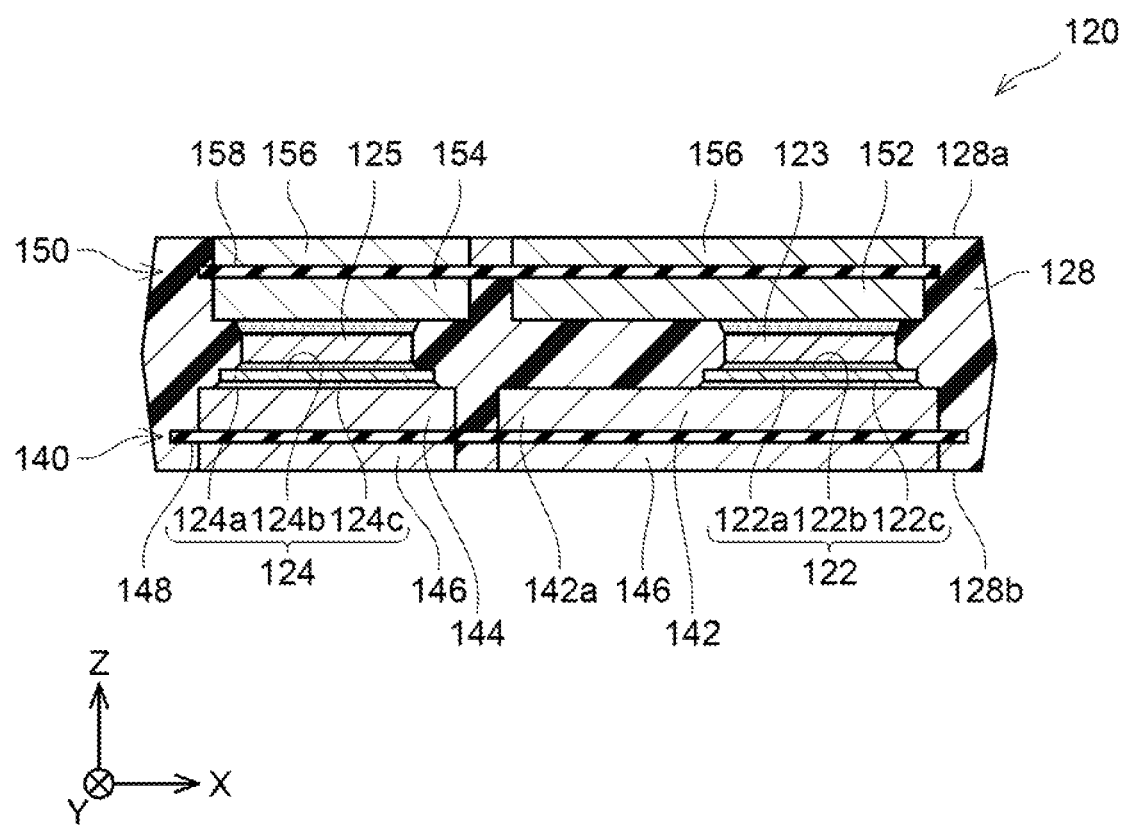
FIG. 18 is a cross-sectional view taken along a line XVIII-XVIII in FIG. 17 and schematically shows an internal structure of the third semiconductor module 120.
Figure 19:
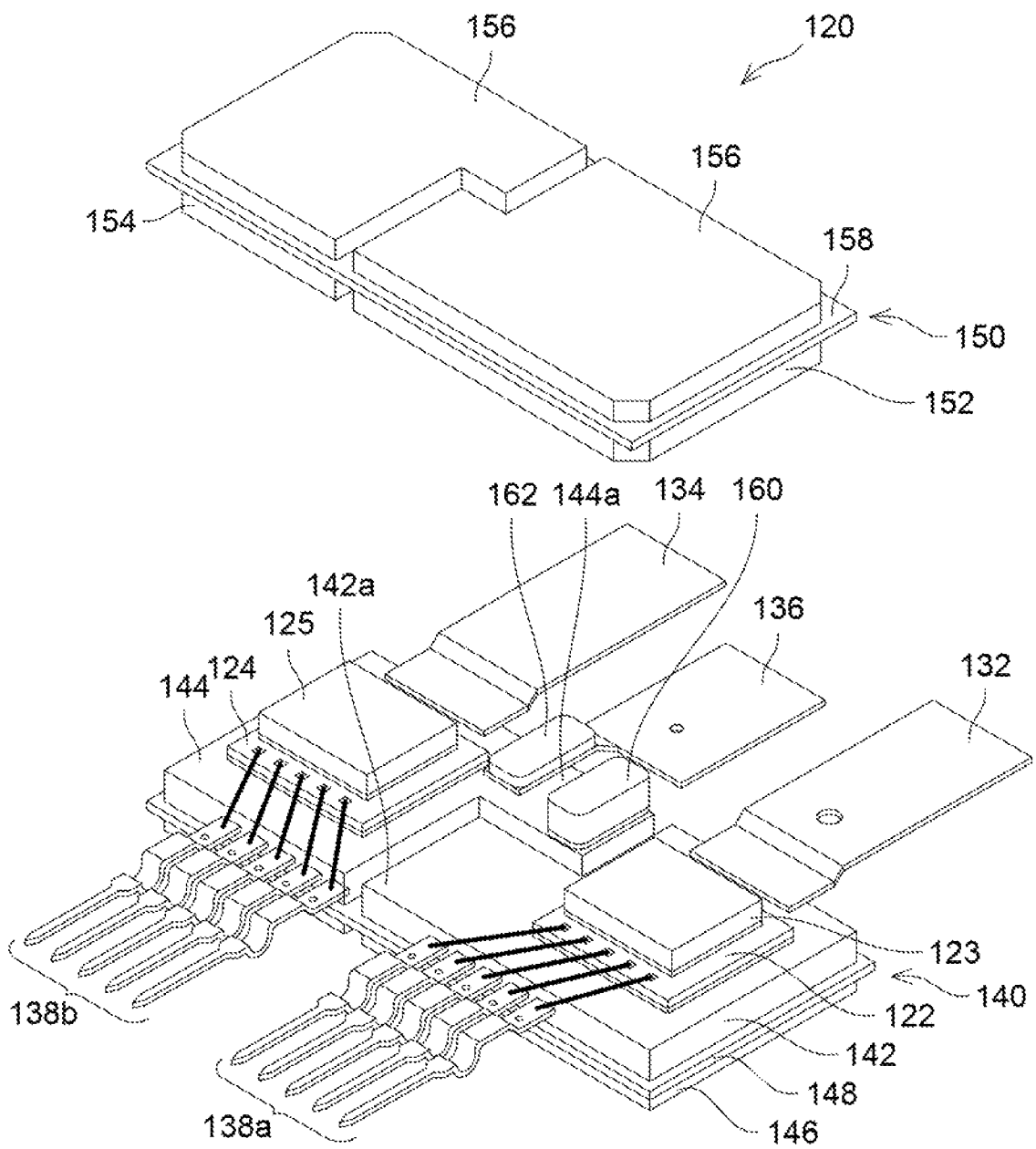
FIG. 19 is a perspective view of the third semiconductor module 120. Illustration of the encapsulant 78 is omitted and a second insulated circuit substrate 150 is upwardly detached.
Figure 20:
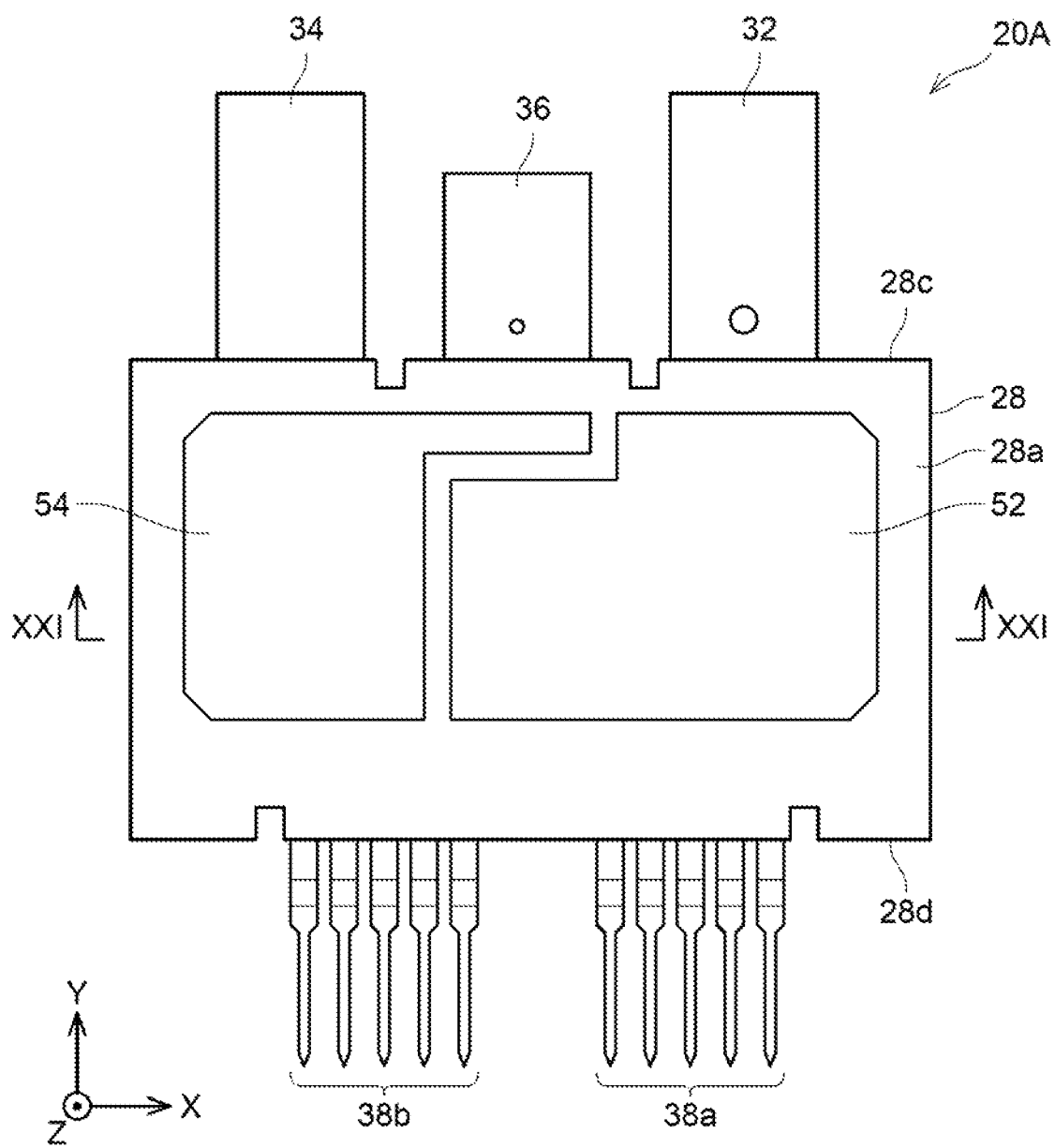
FIG. 20 is a plan view showing an outer appearance of a first semiconductor module 20A of a variant.
Figure 21:
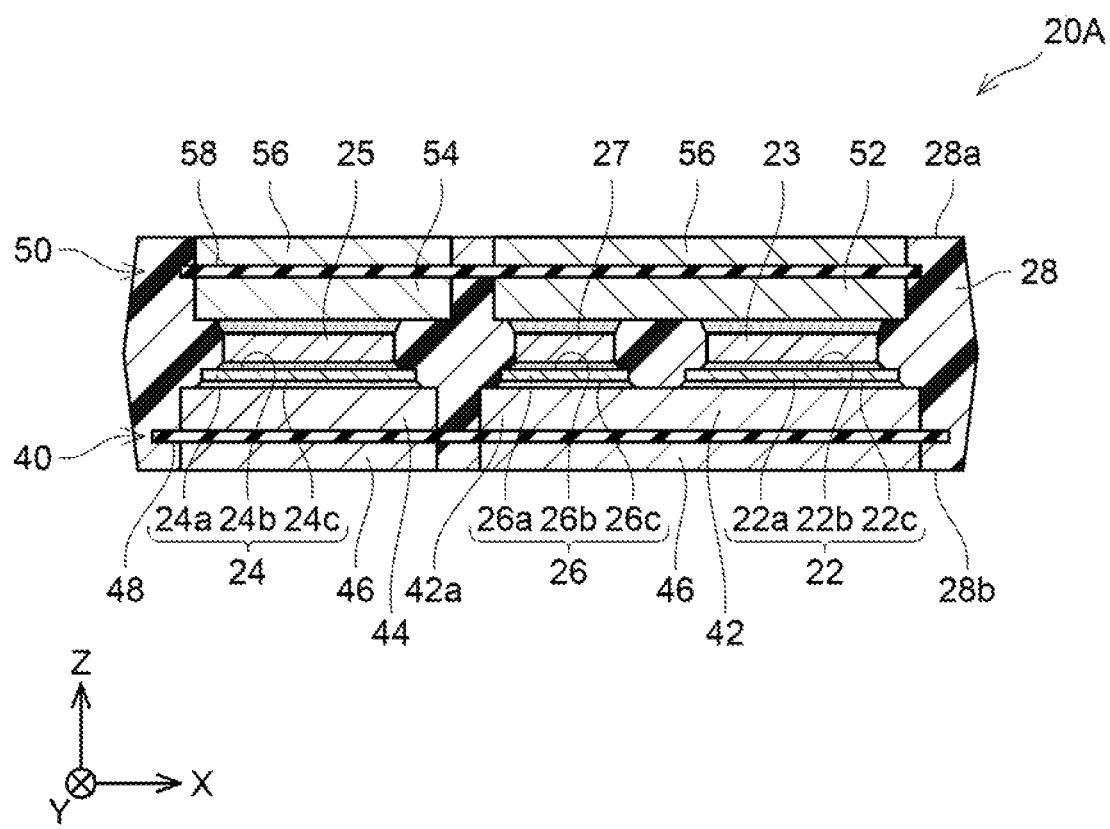
FIG. 21 is a cross-sectional view taken along a line XXI-XXI in FIG. 20 and schematically shows an internal structure of the first semiconductor module 20A of the variant.
Figure 22:
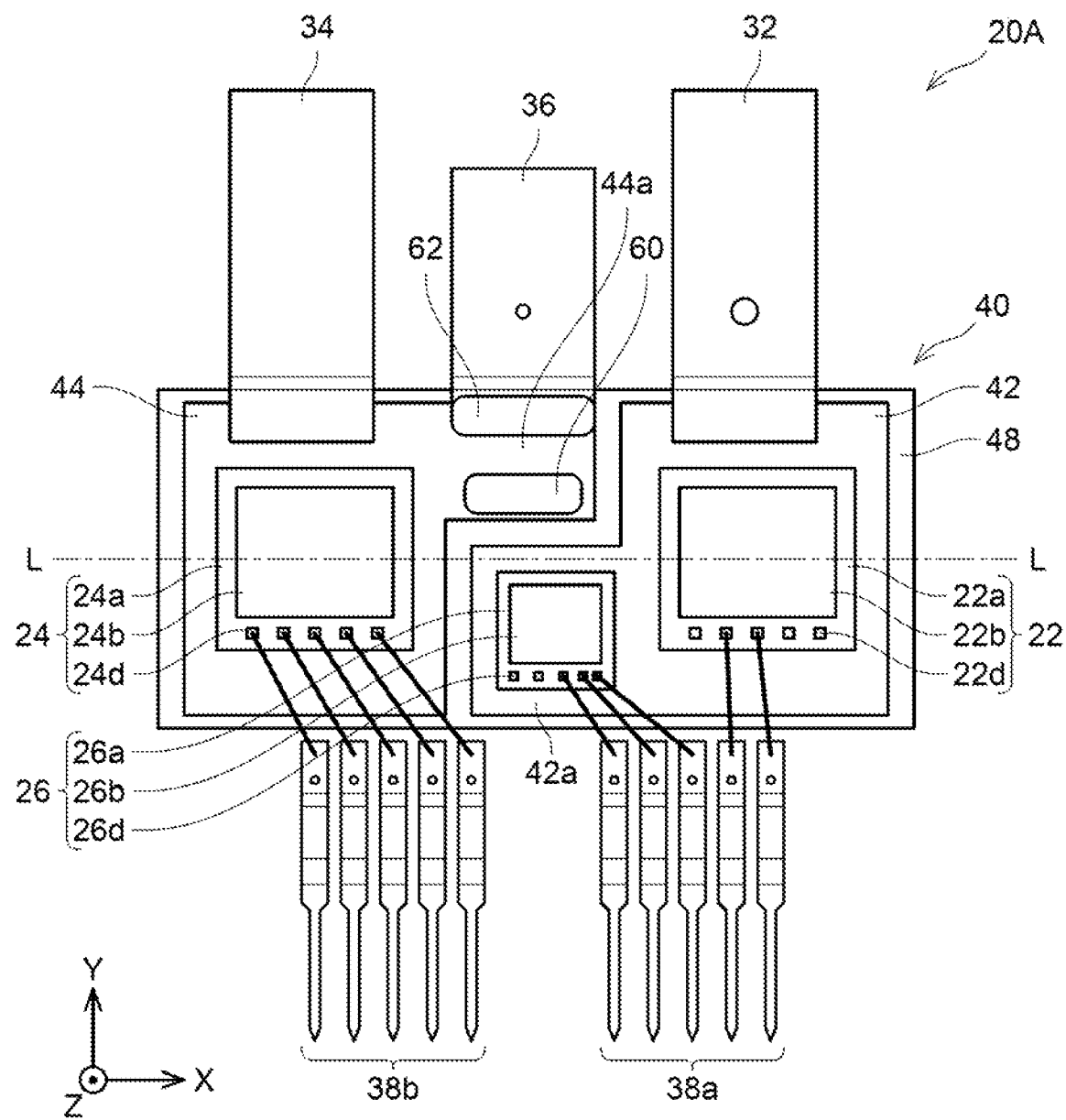
FIG. 22 is a plan view showing the internal structure of the first semiconductor module 20A of the variant.
Figure 23:
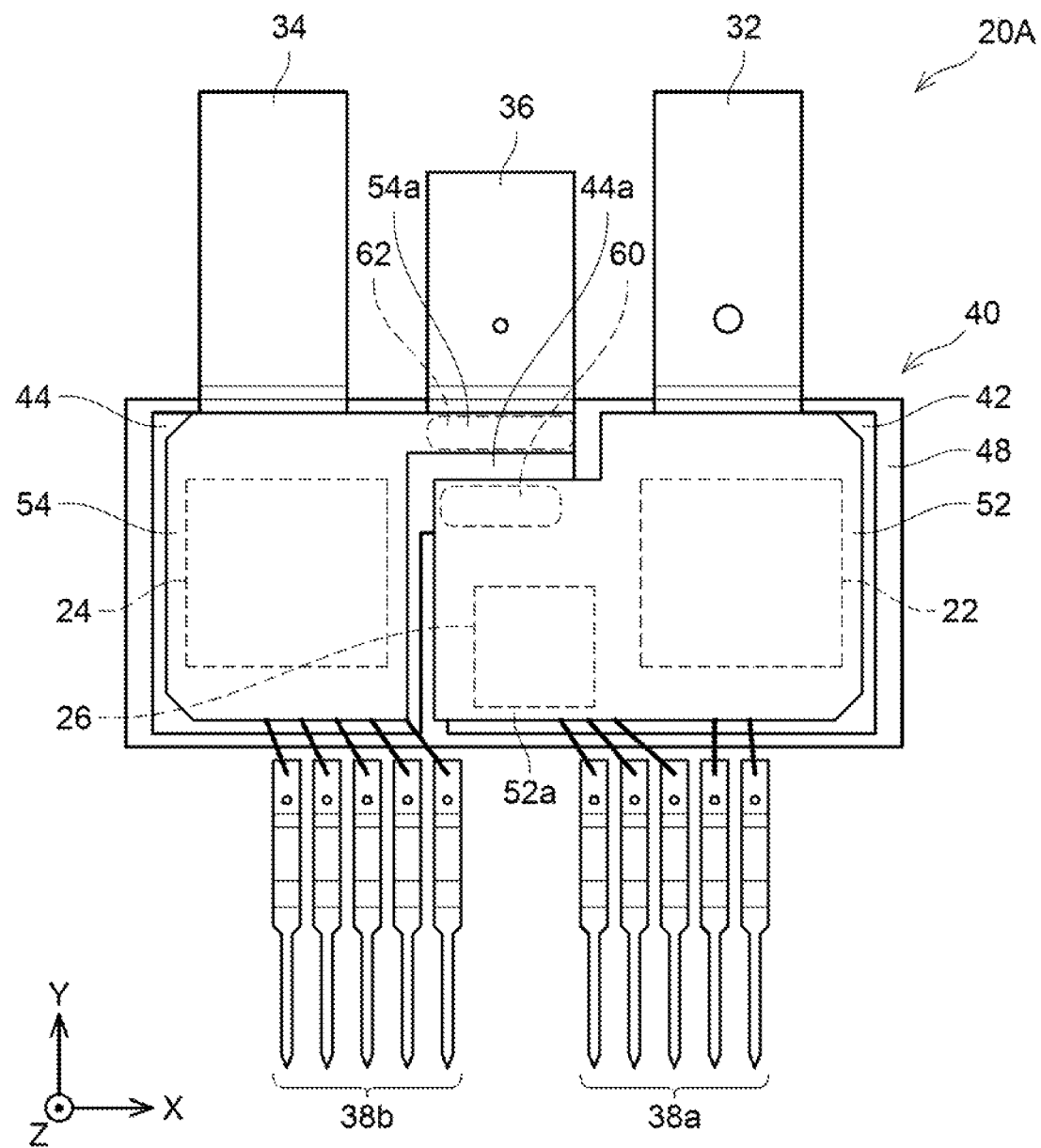
FIG. 23 is a diagram with the second conductor plate 52 and the fourth conductor plate 54 added to the plan view shown in FIG. 22.
Figure 24:
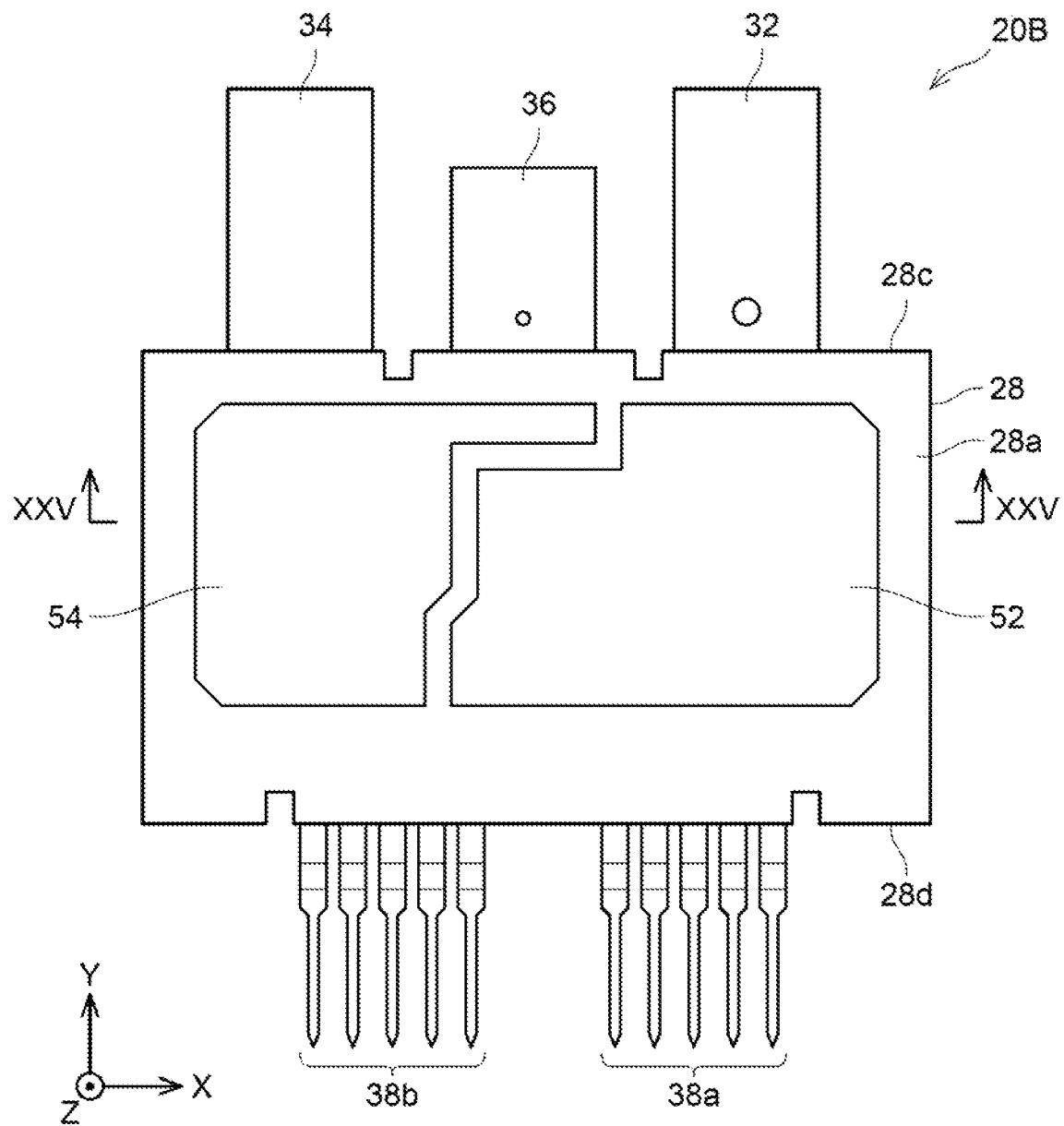
FIG. 24 is a plan view showing an outer appearance of a first semiconductor module 20B of another variant.
Figure 25:
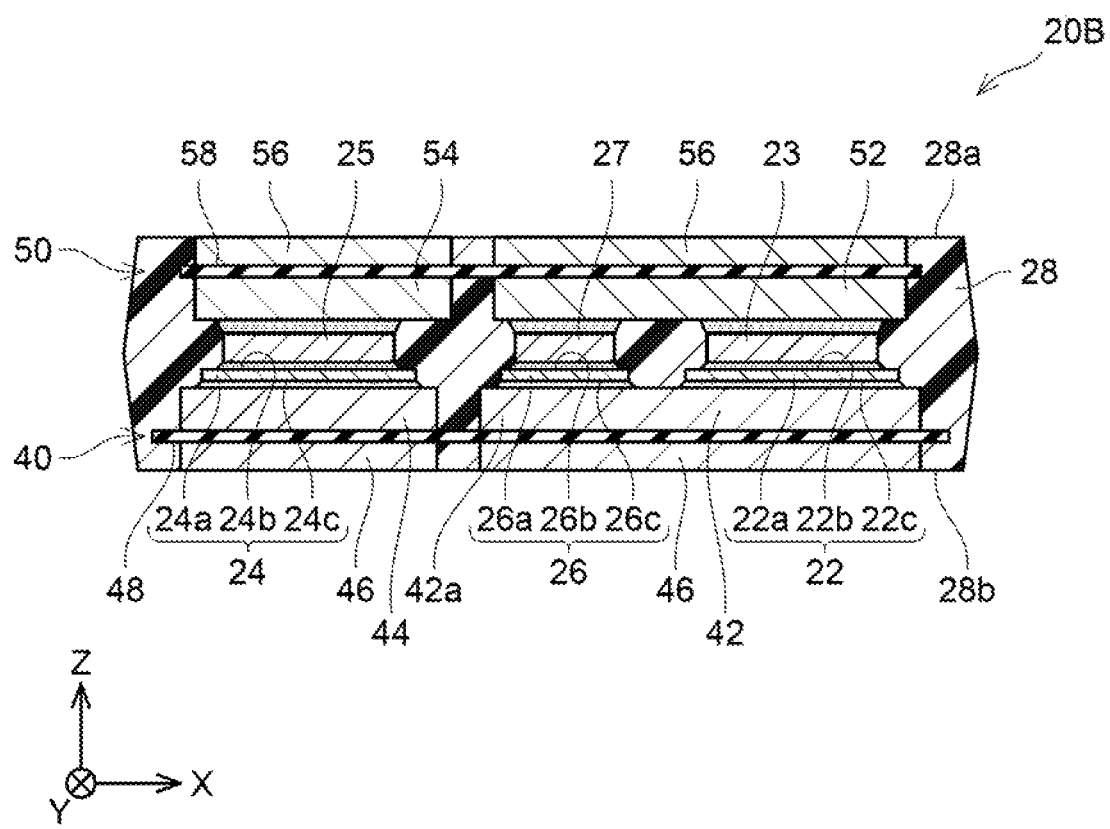
FIG. 25 is a cross-sectional view taken along a line XXV-XXV in FIG. 24 and schematically shows an internal structure of the first semiconductor module 20B of the other variant.
Figure 26:
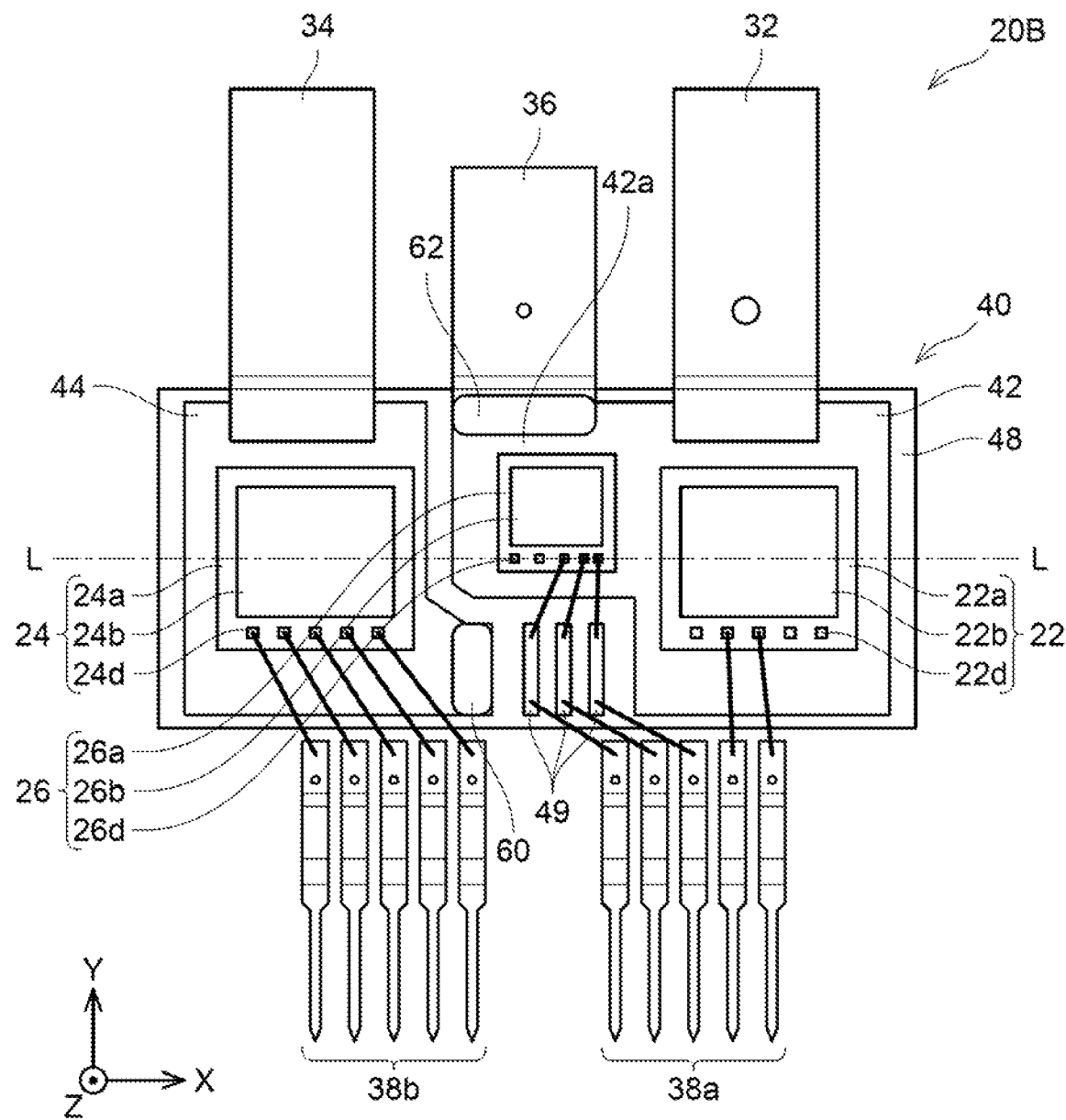
FIG. 26 is a plan view showing the internal structure of the first semiconductor module 20B of the other variant.
Figure 27:
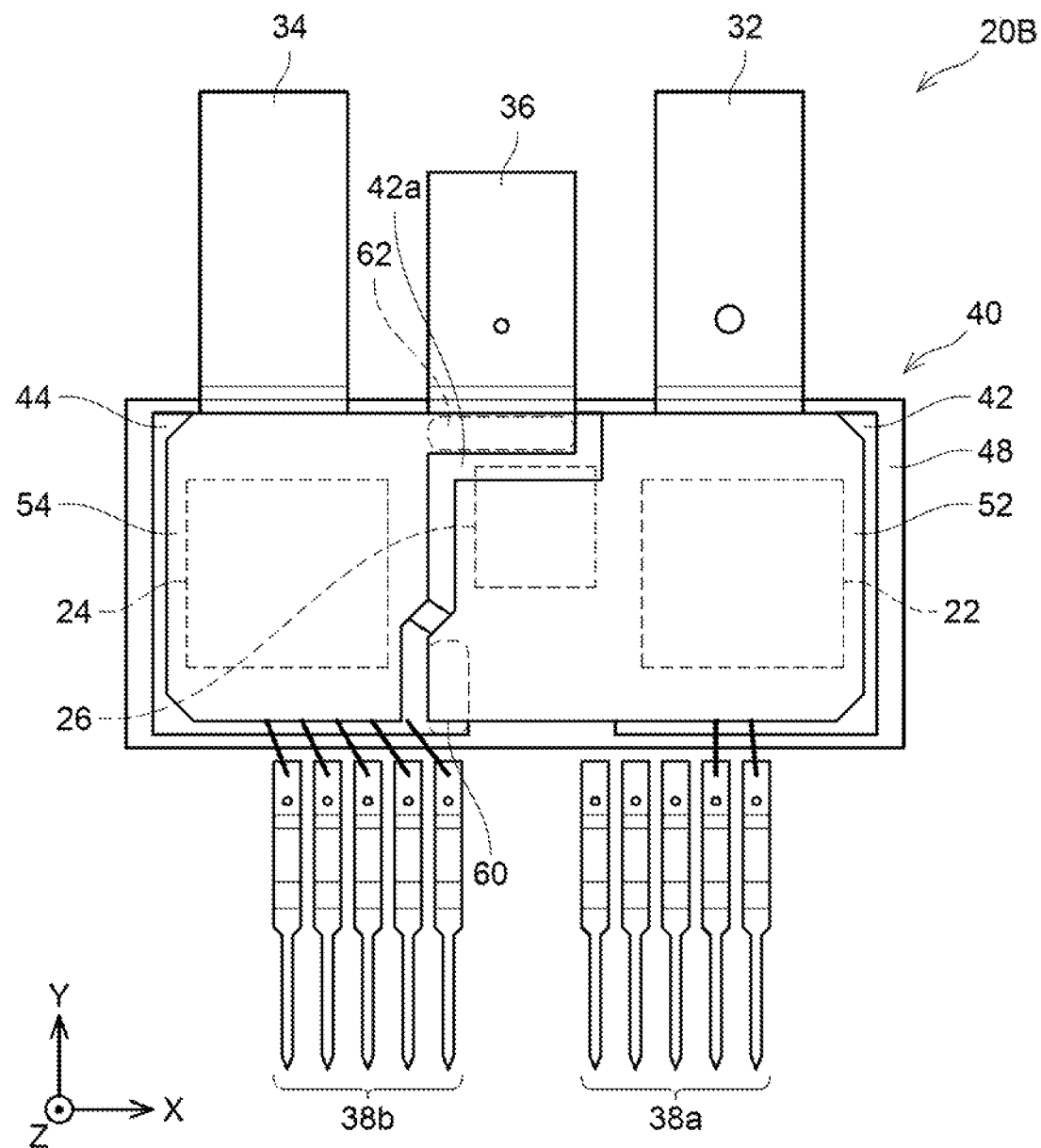
FIG. 27 is a diagram with the second conductor plate 52 and the fourth conductor plate 54 added to the plan view shown in FIG. 26.
Figure 28:
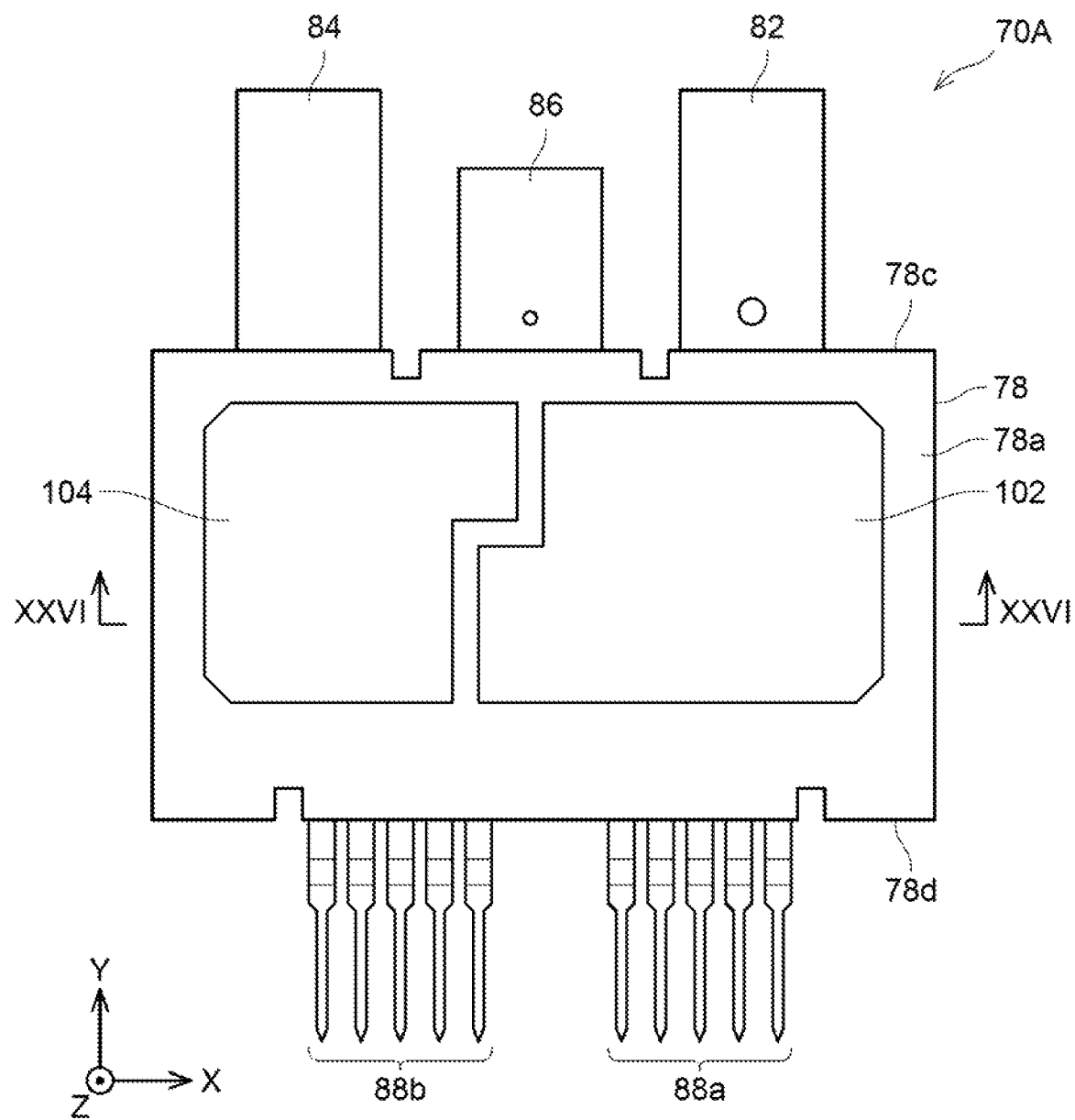
FIG. 28 is a plan view showing an outer appearance of a second semiconductor module 70A of a variant.
Figure 29:
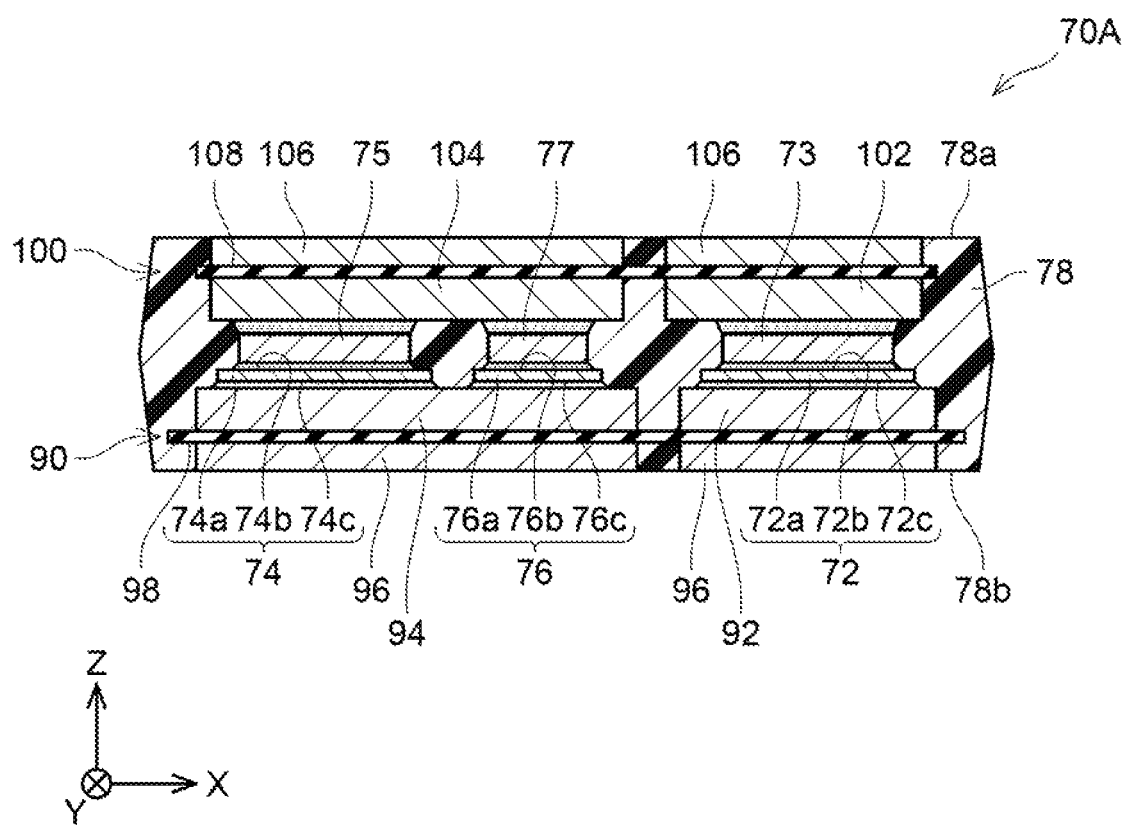
FIG. 29 is a cross-sectional view taken along a line XXIX-XXIX in FIG. 28 and schematically shows an internal structure of the second semiconductor module 70A of the variant.
Figure 30:
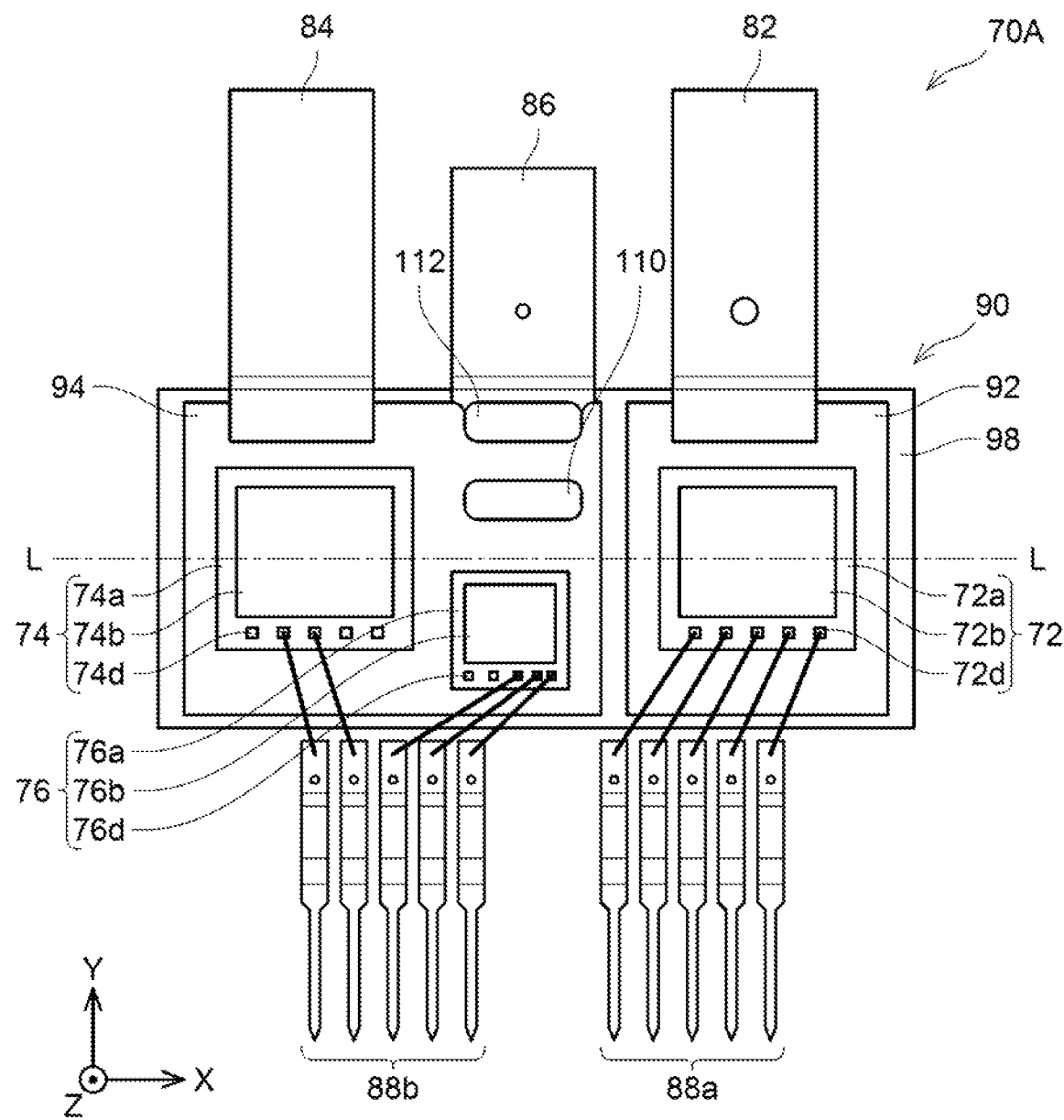
FIG. 30 is a plan view showing the internal structure of the second semiconductor module 70A of the variant.
Figure 31:
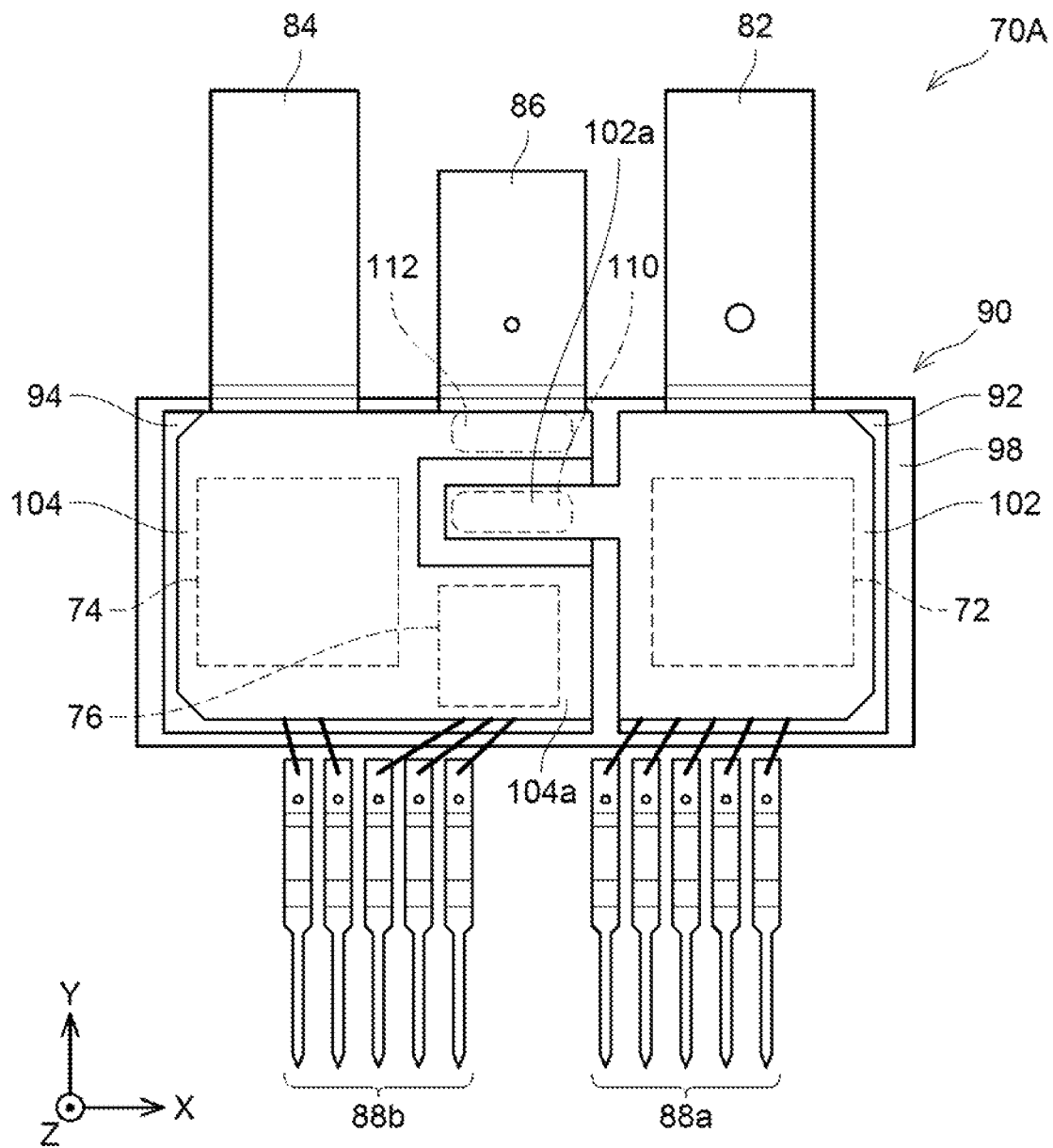
FIG. 31 is a diagram with the second conductor plate 102 and the fourth conductor plate 104 added to the plan view shown in FIG. 30.

Next, referring to FIGS. 17 to 19, the configuration of each third semiconductor module 120 will be described. The configuration of the third semiconductor module 120 is equivalent to the configuration of the first semiconductor module 20 from which the third switching element 26 is removed. That is, the third semiconductor module 120 includes the first switching element 122, the second switching element 124, and an encapsulant 128 that encapsulates these switching elements 122 and 124. The encapsulant 128 has a substantially plate shape, as with the encapsulant 28 of the first semiconductor module 20, and includes an upper surface 128a, a lower surface 128b, a first end surface 128c, and a second end surface 128d.

The third semiconductor module 120 further includes the plurality of power terminals 132, 134 and 136 and a plurality of signal terminals 138a and 138b. The plurality of power terminals 132, 134 and 136 includes the first power terminal 132, the second power terminal 134 and the third power terminal 136. The plurality of signal terminals 138a and 138b includes a plurality of first signal terminals 138a and a plurality of second signal terminals 138b. The plurality of power terminals 132, 134 and 136 and the plurality of signal terminals 138a and 138b in the third semiconductor module 120 have the same configurations and functions as the plurality of power terminals 32, 34 and 36 and the plurality of signal terminals 38a and 38b in the first semiconductor module 20.

The third semiconductor module 120 further includes a first insulated circuit substrate 140 and a second insulated circuit substrate 150. The first insulated circuit substrate 140 and the second insulated circuit substrate 150 in the third semiconductor module 120 have the same structures and functions as the first insulated circuit substrate 40 and the second insulated circuit substrate 50 in the first semiconductor module 20, respectively. That is, the first insulated circuit substrate 140 includes an insulated substrate 148, inner conductor plates 142 and 144, and an outer conductor plate 146. The inner conductor plates 142 and 144 include a first conductor plate 142 and a third conductor plate 144. The second insulated circuit substrate 150 includes an insulated substrate 158, inner conductor plates 152 and 154, and an outer conductor plate 156. The inner conductor plates 152 and 154 include a second conductor plate 152 and a fourth conductor plate 154. The third conductor plate 144 is electrically connected to the second conductor plate 152 via a first coupling portion 160, and the fourth conductor plate 154 is electrically connected to the third power terminal 136 via a second coupling portion 162.

In the third semiconductor module 120, all signal electrodes 122d of the first switching element 122 are connected to the plurality of first signal terminals 138a, and this is different from the first semiconductor module 20. The other configurations of the third semiconductor module 120 are the same as those of the first semiconductor module 20, the duplicate description is omitted herein.

In the power converter 10 of the present embodiment, in each of the U-phase, V-phase, and W-phase switching circuits, the first semiconductor module 20, the second semiconductor module 70, and the third semiconductor module 120 may be stacked on each other in their thickness direction. In this case, the first semiconductor module 20 and the second semiconductor module 70 may be disposed adjacent to each other. Disposing the first semiconductor module 20 and the second semiconductor module 70 adjacent to each other results in reduction in a power loss caused by execution of the first switching control. That is, under the first switching control, the third switching elements 26 and 76 of the first semiconductor module 20 and the second semiconductor module 70 are driven in a complementary manner. At this time, inductances of the first and second semiconductor modules 20 and 70 disposed adjacent to each other can be reduced since magnetic fields generated by energization of the semiconductor modules cancel out each other.

A cooler that uses a refrigerant, such as cooling water, may be interposed between the semiconductor modules 20, 70 and 120. In this case, to suppress an increase in the temperatures of the first semiconductor module 20 and the second semiconductor module 70, the first semiconductor module 20 and the second semiconductor module 70 may be disposed upstream of the refrigerant in the cooler.

FIGS. 20 to 23 show a first semiconductor module 20A of a variant. The configurations of the first coupling portion 60 and the second coupling portion 62 in this first semiconductor module 20A are different, compared to those of the first semiconductor module described above. Specifically, in the first semiconductor module 20A of the present variant, in the plan view perpendicular to the first conductor plate 42 (see FIG. 22), the first coupling portion 60 and the second coupling portion 62 each extend along the first direction (X) and are adjacent to each other in the second direction (Y). With such a configuration, the first coupling portion 60 and the second coupling portion 62 extend along the third switching element 26, by which the current pathway between the third switching element 26 and the first coupling portion 60 (or the second coupling portion 62) can be widened. Due to the above difference, the shapes of the first conductor plate 42, the second conductor plate 52, the third conductor plate 44, and the fourth conductor plate 54 are also different.

The other configurations of the first semiconductor module 20A are the same as those of the first semiconductor module 20 shown in FIGS. 4 to 10. Due to this, in FIGS. 20 to 23, the same or corresponding configurations as those of the first semiconductor module 20 are given the same reference signs. The other configurations of the first semiconductor module 20A can be understood with reference to the description for the above-described first semiconductor module 20, and thus the duplicate description is omitted.

FIGS. 24 to 27 show a first semiconductor module 20B of another variant. The configurations of the first coupling portion 60 and the second coupling portion 62 in this semiconductor module 20B are different, compared to those of the first semiconductor module described above. In the first semiconductor module 20B of the present variant, the first coupling portion 60 and the second coupling portion 62 are located opposite to each other relative to the third switching element 26 with respect to the second direction (Y). That is, in the plan view perpendicular to the first conductor plate 42 (see FIG. 26), the first coupling portion 60 is located on a second end surface 28d side of the encapsulant 28, and the second coupling portion 62 is located on a first end surface 28c side of the encapsulant 28. Further, the first coupling portion 60 extends along the second direction (Y), and the second coupling portion 62 extends along the first direction (X).

In addition, a plurality of signal relay paths 49 is provided at the first insulated circuit substrate 40. Some of the first signal terminals 38a are connected to the signal electrodes 26d of the third switching element 26 via the plurality of signal relay paths 49. The plurality of signal relay paths 49 extends along the second direction (Y) in parallel with the first coupling portion 60, although this is merely an example. In other words, because the first coupling portion 60 extends along the second direction (Y), a space where the plurality of signal relay paths 49 is provided can be ensured in the insulated substrate 48 of the first insulated circuit substrate 40.

The other configurations of the first semiconductor module 20B are the same as those of the first semiconductor module 20 shown in FIGS. 4 to 10. Due to this, in FIGS. 24 to 27, the same or corresponding configuration as those of the first semiconductor module 20 are given the same reference signs. The other configurations of the first semiconductor module 20B can be understood by citing the description for the above-described first semiconductor module 20, and thus the duplicate description is omitted.

FIGS. 28 to 31 show a second semiconductor module 70A of a variant. The configurations of the first coupling portion 110 and the second coupling portion 112 in the second semiconductor module 70A are different, compared to those of the second semiconductor module 70 described above. In the second semiconductor module 70B of the present variant, in the plan view perpendicular to the first conductor plate 92 (see FIG. 30), the first coupling portion 110 and the second coupling portion 112 each extend along the first direction (X) and are adjacent to each other in the second direction (Y). With such a configuration, the first coupling portion 110 and the second coupling portion 112 extend along the third switching element 76, by which the current pathway between the third switching element 76 and the first coupling portion 110 (or the second coupling portion 112) can be widened. Due to the above-described difference, the shapes of the first conductor plate 92, the second conductor plate 102, the third conductor plate 94, and the fourth conductor plate 104 are also be different.

The other configurations of the second semiconductor module 70B are the same as those of the second semiconductor module 70 shown in FIGS. 11 to 16. Due to this, in FIGS. 28 to 31, the same or corresponding configurations as those of the second semiconductor module 70 are given the same reference signs. The other configurations of the second semiconductor module 70B can be understood by citing the description for the above-described second semiconductor module 70, and thus the duplicate description is omitted.

What is claimed is:

1. A semiconductor module, comprising:
a plurality of semiconductor elements; and
a first power terminal, a second power terminal and a third power terminal electrically connected to the plurality of semiconductor elements,
wherein the plurality of semiconductor elements comprises:
at least one upper arm switching element electrically connected between the first power terminal and the second power terminal; and
at least one lower arm switching element electrically connected between the second power terminal and the third power terminal,
wherein a number of the at least one upper arm switching element is different from a number of the at least one lower arm switching element, wherein
the at least one upper arm switching element comprises a first switching element,
the at least one lower arm switching element comprises a second switching element having a same configuration as the first switching element, and
the at least one upper arm switching element or the at least one lower arm switching element further comprises a third switching element having a different configuration from the first switching element, wherein
the first switching element is mainly constituted of a first type of semiconductor material, and
the third switching element is mainly constituted of a second type of semiconductor material different from the first type of semiconductor material.

2. The semiconductor module according to claim 1, wherein a band gap of the second type of semiconductor material is wider than a band gap of the first type of semiconductor material.

3. A semiconductor module comprising:
a plurality of semiconductor elements; and
a first power terminal, a second power terminal and a third power terminal electrically connected to the plurality of semiconductor elements,
wherein the plurality of semiconductor elements comprises:
at least one upper arm switching element electrically connected between the first power terminal and the second power terminal; and
at least one lower arm switching element electrically connected between the second power terminal and the third power terminal,
wherein a number of the at least one upper arm switching element is different from a number of the at least one lower arm switching element, wherein
the at least one upper arm switching element comprises a first switching element,
the at least one lower arm switching element comprises a second switching element having a same configuration as the first switching element, and
the at least one upper arm switching element or the at least one lower arm switching element further comprises a third switching element having a different configuration from the first switching element,
wherein a size of the third switching element is smaller than a size of the first switching element.

4. A semiconductor module comprising:
a plurality of semiconductor elements; and
a first power terminal, a second power terminal and a third power terminal electrically connected to the plurality of semiconductor elements,
wherein the plurality of semiconductor elements comprises:
at least one upper arm switching element electrically connected between the first power terminal and the second power terminal;
at least one lower arm switching element electrically connected between the second power terminal and the third power terminal,
wherein a number of the at least one upper arm switching element is different from a number of the at least one lower arm switching element, wherein
the at least one upper arm switching element comprises a first switching element,
the at least one lower arm switching element comprises a second switching element having a same configuration as the first switching element, and
the at least one upper arm switching element or the at least one lower arm switching element further comprises a third switching element having a different configuration from the first switching element;
a first conductor plate on which the at least one upper arm switching element is disposed;
a second conductor plate opposed to the first conductor plate with the at least one upper arm switching element interposed therebetween;
a third conductor plate on which the at least one lower arm switching element is disposed, the third conductor plate being arranged side by side with the first conductor plate in a first direction and being electrically connected to the second conductor plate; and
a fourth conductor plate opposed to the third conductor plate with the at least one lower arm switching element interposed therebetween and arranged side by side with the second conductor plate in the first direction,
wherein
the first power terminal is electrically connected to the first conductor plate,
the second power terminal is electrically connected to the second conductor plate or the third conductor plate, and
the third power terminal is electrically connected to the fourth conductor plate.

5. The semiconductor module according to claim 4, wherein
the first switching element and the second switching element are arranged along the first direction, and
the third switching element is located between the first switching element and the second switching element with respect to the first direction.

6. The semiconductor module according to claim 5, wherein in a plan view perpendicular to the first conductor plate, a center of the third switching element is offset from a straight line passing through centers of the first switching element and the second switching element.

7. The semiconductor module according to claim 5, wherein
the third conductor plate is electrically connected to the second conductor plate via a first coupling portion,
the third power terminal is electrically connected to the fourth conductor plate via a second coupling portion,
the first coupling portion and the second coupling portion are located between the first switching element and the second switching element with respect to the first direction.

8. The semiconductor module according to claim 7, wherein the first coupling portion and the second coupling portion are located on a same side relative to the third switching element with respect to a second direction parallel to the first conductor plate and perpendicular to the first direction.

9. The semiconductor module according to claim 8, wherein in a plan view perpendicular to the first conductor plate, the first coupling portion and the second coupling portion each extend along the first direction and are adjacent to each other in the second direction.

10. The semiconductor module according to claim 8, wherein in a plan view perpendicular to the first conductor plate, the first coupling portion and the second coupling portion each extend along the second direction and are adjacent to each other in the first direction.

11. The semiconductor module according to claim 7, wherein the first coupling portion and the second coupling portion are located opposite to each other relative to the third switching element with respect to a second direction parallel to the first conductor plate and perpendicular to the first direction.

12. The semiconductor module according to claim 11, wherein in a plan view perpendicular to the first conductor plate, the first coupling portion extends along the second direction, and the second coupling portion extends along the first direction.

13. The semiconductor module according to claim 4, wherein in a plan view perpendicular to the first conductor plate, the first power terminal, the second power terminal, and the third power terminal are arranged along the first direction, and the third power terminal is located between the first power terminal and the second power terminal.

14. The semiconductor module according to claim 4, wherein
the third switching element is included in the at least one upper arm switching element,
the first conductor plate comprises a first protrusion protruding toward the third conductor plate along the first direction, and
at least a part of the third switching element is located at the first protrusion.

15. The semiconductor module according to claim 14, wherein
the second conductor plate comprises a second protrusion protruding toward the fourth conductor plate along the first direction and opposed to the first protrusion, and
at least a part of the second protrusion is opposed to the first protrusion with the third switching element interposed therebetween.

16. The semiconductor module according to claim 14, wherein
the third conductor plate comprises a third protrusion protruding toward the first conductor plate along the first direction and adjacent to the first protrusion in a second direction perpendicular to the first direction, and
the third conductor plate is electrically connected to the second conductor plate at the third protrusion.

17. The semiconductor module according to claim 16, wherein the fourth conductor plate comprises a fourth protrusion protruding toward the second conductor plate along the first direction and at least partly opposed to the third protrusion, and the fourth conductor plate is electrically connected to the third power terminal at the fourth protrusion.

18. The semiconductor module according to claim 4, wherein the third switching element is included in the at least one lower arm switching element, the fourth conductor plate comprises a fourth protrusion protruding toward the second conductor plate along the first direction, and at least a part of the fourth protrusion is opposed to the third conductor plate with the third switching element interposed therebetween.

19. The semiconductor module according to claim 18, wherein the second conductor plate comprises a second protrusion protruding toward the fourth conductor plate along the first direction and adjacent to the fourth protrusion in a second direction perpendicular to the first direction, and the second conductor plate is electrically connected to the third conductor plate at the second protrusion.

20. The semiconductor module according to claim 4, further comprising:

a first insulated circuit substrate; and a second insulated circuit substrate opposed to the first insulated circuit substrate with the plurality of semiconductor elements interposed therebetween, wherein the first conductor plate and the third conductor plate are provided in the first insulated circuit substrate, and the second conductor plate and the fourth conductor plate are provided in the second insulated circuit substrate.

\* \* \* \* \*